(12) United States Patent
Lu

(10) Patent No.: US 10,103,107 B1
(45) Date of Patent: Oct. 16, 2018

(54) SEMICONDUCTOR DEVICE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/671,821

(22) Filed: Aug. 8, 2017

(51) Int. Cl.
| | |
|---|---|
| *H01L 23/552* | (2006.01) |
| *H01L 23/00* | (2006.01) |
| *H01L 23/31* | (2006.01) |
| *H01L 21/56* | (2006.01) |
| *H01L 21/02* | (2006.01) |
| *H01L 23/522* | (2006.01) |
| *H01L 21/768* | (2006.01) |
| *H01L 23/532* | (2006.01) |

(52) U.S. Cl.
CPC ...... *H01L 23/552* (2013.01); *H01L 21/02244* (2013.01); *H01L 21/56* (2013.01); *H01L 21/76802* (2013.01); *H01L 21/76843* (2013.01); *H01L 21/76877* (2013.01); *H01L 21/76888* (2013.01); *H01L 23/3135* (2013.01); *H01L 23/3171* (2013.01); *H01L 23/5226* (2013.01); *H01L 23/53238* (2013.01); *H01L 24/03* (2013.01); *H01L 24/05* (2013.01); *H01L 24/11* (2013.01); *H01L 24/13* (2013.01); *H01L 2224/0231* (2013.01); *H01L 2224/02373* (2013.01); *H01L 2224/0401* (2013.01); *H01L 2224/12105* (2013.01); *H01L 2224/1308* (2013.01); *H01L 2224/13024* (2013.01); *H01L 2224/13084* (2013.01)

(58) Field of Classification Search
CPC . H01L 23/552; H01L 21/02244; H01L 21/56; H01L 21/76802; H01L 21/76843; H01L 21/76877; H01L 21/76888; H01L 23/3135; H01L 23/3171; H01L 23/5226; H01L 23/53238; H01L 24/03; H01L 24/05; H01L 24/11; H01L 24/13
See application file for complete search history.

(56) References Cited

U.S. PATENT DOCUMENTS

| | | | |
|---|---|---|---|
| 9,024,207 B2 | 5/2015 | Ogawa et al. | |
| 9,508,664 B1 | 11/2016 | Lin et al. | |
| 2015/0221680 A1* | 8/2015 | Nakata | G02F 1/136204 349/40 |
| 2017/0005034 A1 | 1/2017 | Su et al. | |
| 2017/0186823 A1* | 6/2017 | Kim | H01L 27/3213 |

* cited by examiner

*Primary Examiner* — Karen Kusumakar
(74) *Attorney, Agent, or Firm* — Foley & Lardner LLP; Cliff Z. Liu

(57) ABSTRACT

A semiconductor device includes at least one base element, at least one passivation layer, at least one circuit layer and at least one light absorbing layer. The base element includes at least one conductive pad. The passivation layer is disposed on the base element. The circuit layer is electrically connected to the conductive pad and disposed in the passivation layer. The light absorbing layer is disposed on the circuit layer.

19 Claims, 16 Drawing Sheets

SEMICONDUCTOR DEVICE AND METHOD FOR MANUFACTURING THE SAME

BACKGROUND

1. Field of the Disclosure

The present disclosure relates to a semiconductor device and a manufacturing method, and more particularly to a semiconductor device including at least one light absorbing layer, and a method for manufacturing the semiconductor device.

2. Description of the Related Art

A semiconductor package may include a conductive via for electrical connection between different layers of the semiconductor package. The process of formation of the conductive via may include forming a dielectric layer covering a surface of a base material, forming a hole in the dielectric layer to expose a portion of the base material, and disposing a conductive material in the hole. The dielectric layer is generally a photoimageable material, such as a polymer. However, during the process, a nodule (e.g., a protrusion of the dielectric layer) may be formed adjacent to two ends of the sidewall of the hole, which may result in defects of the conductive via.

SUMMARY

In some embodiments, according to an aspect, a semiconductor device includes at least one base element, at least one passivation layer, at least one circuit layer and at least one light absorbing layer. The base element includes at least one conductive pad. The passivation layer is disposed on the base element. The circuit layer is electrically connected to the conductive pad and disposed in the passivation layer. The light absorbing layer is disposed on the circuit layer.

In some embodiments, according to another aspect, a method for manufacturing a semiconductor device includes: forming at least one passivation layer on a base element; forming at least one first conductive layer in the passivation layer to electrically connect the base element; forming at least one light absorbing layer on the first conductive layer; and forming at least one second conductive layer to electrically connect the first conductive layer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
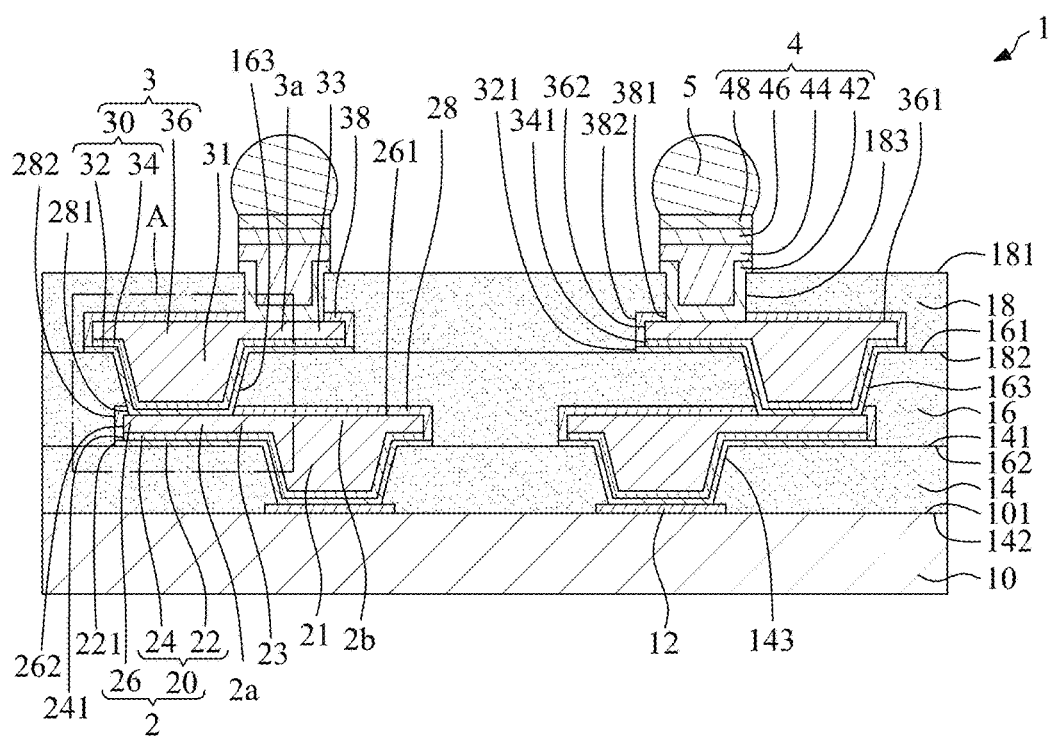
FIG. 1 illustrates a cross-sectional view of an example of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a semiconductor device which includes at least one light absorbing layer disposed on a circuit layer, and techniques for manufacturing the semiconductor device.

According to some embodiments, a method for manufacturing a conductive via structure may include the following steps. A substrate is provided. The substrate includes a base material such as a first circuit layer. A dielectric layer (or a passivation layer) is formed to cover a surface of the base material. A hole is formed in the dielectric layer to expose a portion of the base material. The dielectric layer may be a "positive" acting photoimageable material, or a "negative" acting photoimageable material. For the "positive" acting photoimageable material, a portion of the photoimageable material uncovered by a mask is subject to radiation and soluble to a developer while another portion of the material covered by the mask is to remain insoluble to the developer. Thus, a patterned dielectric layer (e.g., including the hole) is formed through the application of radiation and the developer. For the "negative" acting photoimageable material, a portion of the photoimageable material uncovered by a mask is subject to radiation and insoluble to a developer while another portion of the material covered by the mask is soluble to the developer. Thus, a patterned dielectric layer (e.g., including the hole) is formed through the application of radiation and the developer.

In some embodiments, a through hole of a mask is disposed above a position corresponding to the hole to be formed, and the "positive" acting photoimageable material is exposed to a radiation source. After radiation, a portion of the photoimageable material, which is uncovered by the mask, absorbs the radiation and is dissolved in a developer. Thus, the hole is formed to expose a portion of the base material. Then, a portion of a conductive material is disposed in the hole to form the conductive via structure. Another portion of the conductive material is disposed on the dielectric layer to form a second circuit layer. Therefore, the first circuit layer is electrically connected to the second circuit layer through the conductive via structure.

Since the photoimageable material is "positive" acting, light beams reflected by the base material under the dielectric layer may result in undesired nodules. For example, a portion of light beams may be reflected by the base material and then their light paths turn upward and thus influence the light beams along the original paths (e.g., downward paths), resulting in a nodule of the dielectric layer adjacent to an upper end of the hole and/or a nodule at a lower end of the hole. Due to the existence of the nodules, the conductive material may not be sufficiently formed inside the hole of the dielectric layer, thus causing defects or even failure of the conductive via structure. In some embodiments, the smaller the diameter of the hole, the more noticeable is the effect of the nodule.

At least some embodiments of the present disclosure address at least the above concerns and disclose a semiconductor device including a light absorbing layer, and techniques for manufacturing the semiconductor device. In one or more embodiments of the present disclosure, the nodules of the dielectric layer can be sufficiently reduced or avoided, which improves the yield rate of the conductive via structure and the yield rate of the semiconductor device.

Figure 1A:
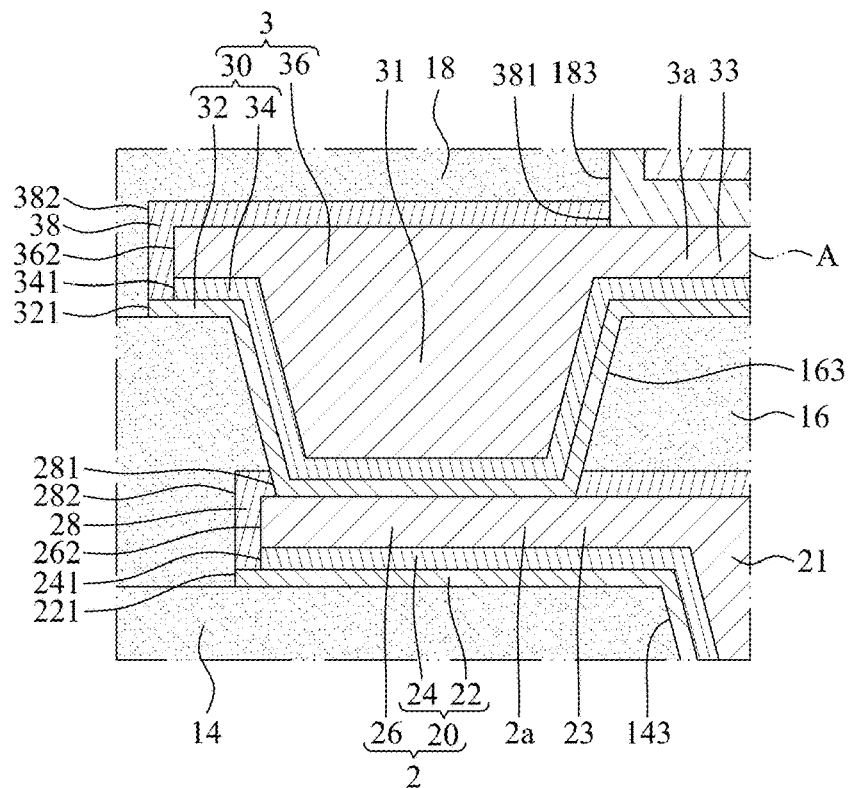
FIG. 1A illustrates an enlarged view of an area A in FIG. 1.

FIG. 1 illustrates a cross-sectional view of an example of a semiconductor device 1 according to some embodiments of the present disclosure. FIG. 1A illustrates an enlarged view of the area A in FIG. 1. The semiconductor device 1 includes at least one base element 10, at least one passivation layer (including, for example, a first passivation layer 14, a second passivation layer 16 and a third passivation layer 18), at least one circuit layer (including, for example, a first circuit layer 2 and a second circuit layer 3), at least one light absorbing layer (including, for example, a first light absorbing layer 28 and a second light absorbing layer 38), a plurality of bump pads 4 and a plurality of external connectors 5.

The base element 10 may be a substrate or a semiconductor wafer, and includes a first surface 101 and at least one conductive pad 12 adjacent to the first surface 101. The material of the base element 10 may include, for example, a semiconductor material (e.g., silicon), glass, ceramic, organic material, metal (e.g., copper (Cu), nickel (Ni), a combination of silver and tin (Ag/Sn), and palladium (Pd)), or a combination of two or more thereof.

The first passivation layer 14 is disposed on and covers the first surface 101 of the base element 10. The first passivation layer 14 may include, or be formed from, a photoresist layer, a cured photo sensitive material, a cured photoimageable dielectric (PID) material such as epoxy or polyimide (PI) including photoinitiators, or a combination of two or more thereof. The first passivation layer 14 can be provided in a film form or in a liquid form. For example, the first passivation layer 14 can be formed from a "positive" acting material or a "negative" acting photoimageable material, such as epoxy resins or acrylic resins. Such a "positive" acting material is a type of resin in which the portion of the resin exposed to a radiation source (e.g., ultraviolet (UV) source) becomes dissolvable to a developer (e.g., an organic solvent). The unexposed portion of the resin is insoluble in the developer. The first passivation layer 14 has a first surface 141 and a second surface 142 opposite to the first surface 141, and defines at least one first opening 143. In some embodiments, the second surface 142 of the first passivation layer 14 contacts the first surface 101 of the base element 10. The first opening 143 extends through the first passivation layer 14 so as to expose the conductive pad 12 of the base element 10.

The first circuit layer 2 is disposed on the conductive pad 12 of the base element 10 in the first opening 143 of the first passivation layer 14 and on the first passivation layer 14. In some embodiments, a portion of the first circuit layer 2 is disposed in the first opening 143 of the first passivation layer 14 so to form a first conductive via 21, and the other portion of the first circuit layer 2 is disposed on the first surface 141 of the first passivation layer 14 so as to form a first patterned layer 23 which may include at least one trace and/or at least one pad. The first conductive via 21 is electrically connected to and contacts the conductive pad 12 of the base element 10. The first conductive via 21 is disposed in the first passivation layer 14. The first conductive via 21 and the first patterned layer 23 may be formed integrally and concurrently. The first patterned layer 23 is electrically connected to the conductive pad 12 of the base element 10 through the first conductive via 21. A ratio of line width/line space (L/S) of the first circuit layer 2 may be less than, for example, about 7 μm/7 μm, about 5 μm/5 μm, or about 2 μm/2 μm.

As shown in FIG. 1, the first circuit layer 2 includes a first seed layer 20 and a first metal layer 26. The first seed layer 20 is disposed on the conductive pad 12 of the base element 10 in the first opening 143 and on the first passivation layer 14. The first metal layer 26 is disposed on the first seed layer 20. In some embodiments, the first seed layer 20 may be a two-layered structure, and may include a lower layer 22 and an upper layer 24. The material of the lower layer 22 may be titanium (Ti), and the material of the upper layer 24 may be copper (Cu), and the material of the first metal layer 26 may be copper (Cu). It is noted that the first conductive via 21 may include the first seed layer 20 and the first metal layer 26, and the first patterned layer 23 may also include the first seed layer 20 and the first metal layer 26. Further, the lower layer 22 has a lateral surface 221, and the upper layer 24 has a lateral surface 241. The lateral surface 221 of the lower layer 22 may not be coplanar with the lateral surface 241 of the upper layer 24.

The at least one light absorbing layer (including, for example, a first light absorbing layer 28 and a second light absorbing layer 38) is disposed on the at least one circuit layer (including, for example, a first circuit layer 2 and a second circuit layer 3). As shown in FIG. 1, the first light absorbing layer 28 is disposed on the first circuit layer 2. In some embodiments, the first light absorbing layer 28 may be a black or brown layer that can absorb most or all light beams that are emitted by a radiation source (e.g., UV source) and reach the first light absorbing layer 28. That is, few or no light beams are reflected by the first light absorbing layer 28. In some embodiments, the first light absorbing layer 28 may be an oxide layer (e.g., copper oxide) that is an oxidized portion of the first circuit layer 2. Thus, the first light absorbing layer 28 is disposed on a top surface 261 and a lateral surface 262 of the first metal layer 26 of the first circuit layer 2. It is understood that the first light absorbing layer 28 may be included as a portion of the first circuit layer 2, or the first light absorbing layer 28 may be an additional layer that is attached or formed on the first circuit layer 2.

The first light absorbing layer 28 extends to at least a portion of a lateral surface of the first seed layer 20. In some embodiments, the first light absorbing layer 28 may cover the entire lateral surface of the first seed layer 20. However, in the embodiment illustrated in FIG. 1, the first light absorbing layer 28 extends to and covers the lateral surface 241 of the upper layer 24 of the first seed layer 20. The lateral surface 221 of the lower layer 22 of the first seed layer 20 is exposed from the first light absorbing layer 28. That is, in some embodiments, the first light absorbing layer 28 does not extend to or cover the lateral surface 221 of the lower layer 22 of the first seed layer 20. As shown in FIG. 1, the lateral surface 262 of the first metal layer 26 is substantially coplanar with the lateral surface 241 of the upper layer 24 of the first seed layer 20, both of which are not coplanar with the lateral surface 221 of the lower layer 22 of the first seed layer 20. A lateral surface 282 of the first light absorbing layer 28 is substantially coplanar with the lateral surface 221 of the lower layer 22 of the first seed layer 20. The first light absorbing layer 28 may contact at least a portion of the top surface of the lower layer 22 of the first seed layer 20.

In some embodiments, a surface roughness of the first surface 141 of the first passivation layer 14 may be small, and a surface roughness of the top surface 261 of the first meal layer 26 may be small as well. Without the first light absorbing layer 28, the second passivation layer 16 may be easily peeled off (also referred to as delamination) from the first metal layer 26 and the first passivation layer 14. In some embodiments, to avoid delamination, a surface roughness of the light absorbing layer is greater than a surface roughness of the passivation layer. In the embodiment illustrated in FIG. 1, the surface roughness of the first light absorbing layer 28 is greater than the surface roughness of the first surface 141 of the first passivation layer 14 so as to enhance the bonding force or attaching force between the second passivation layer 16 and the first light absorbing layer 28 (and the first circuit layer 2), and therefore to reduce the risk of the delamination between the second passivation layer 16 and the first light absorbing layer 28 (and the first circuit layer 2), which improves the yield rate of the semiconductor device 1. Further, in some embodiments, the first light absorbing layer 28 has a dark or black color whereas the first passivation layer 14 and the second passivation layer 16 are substantially transparent. The first light absorbing layer 28 can be observed for positioning and defect detecting through the transparent passivation layers 14 and 16.

As shown in FIG. 1, the first light absorbing layer 28 may define at least one first through hole 281, and the first through hole 281 extends through the first light absorbing layer 28 so as to expose a first region 2a of the first circuit layer 2. That is, the first region 2a of the first circuit layer 2 is uncovered by the first light absorbing layer 28. In addition, the first circuit layer 2 further includes a second region 2b covered by the first light absorbing layer 28. The first through hole 281 of the first light absorbing layer 28 may be formed by, e.g., etching. A surface roughness of the first region 2a of the first circuit layer 2 may be greater than a surface roughness of the second region 2b of the first circuit layer 2.

The second passivation layer 16 is disposed on and covers the first surface 141 of the first passivation layer 14 and the first light absorbing layer 28 (and the first circuit layer 2). The second passivation layer 16 may include, or be formed from, a photoresist layer, a cured photo sensitive material, a cured photoimageable dielectric (PID) material such as epoxy or polyimide (PI) including photoinitiators, or a combination of two or more thereof. The second passivation layer 16 can be provided in a film form or in a liquid form. For example, the second passivation layer 16 can be formed from a "positive" acting material or a "negative" acting photoimageable material, such as epoxy resins or acrylic resins. The material of the second passivation layer 16 may be the same as or different from the material of the first passivation layer 14. The second passivation layer 16 has a first surface 161 and a second surface 162 opposite to the first surface 161, and defines at least one second opening 163. In some embodiments, the second surface 162 of the second passivation layer 16 contacts the first surface 141 of the first passivation layer 14 directly so as to enhance the adhesion therebetween. Further, the second opening 163 of the second passivation layer 16 extends through the second passivation layer 16, and corresponds to the first through hole 281 of the first light absorbing layer 28 so as to expose the first region 2a of the first circuit layer 2.

In some embodiments, during a manufacturing process, the first light absorbing layer 28 can absorb most or all light beams that reach the first light absorbing layer 28. Thus, the original light beams radiating upon the second passivation layer 16 are not be influenced by light beams reflected by the first light absorbing layer 28. No nodule is formed. Therefore, the second opening 163 of the second passivation layer 16 can be formed precisely without defects even when the diameter of the second opening 163 is very small.

The second circuit layer 3 is disposed on the first region 2a of the first circuit layer 2 in the second opening 163 of the second passivation layer 16 and the first through hole 281 of the first light absorbing layer 28, and on the second passivation layer 16. In some embodiments, a portion of the second circuit layer 3 is disposed in the second opening 163 of the second passivation layer 16 so to form a second conductive via 31, and the other portion of the second circuit layer 3 is disposed on the first surface 161 of the second passivation layer 16 so as to form a second patterned layer 33 which may include at least one trace and/or at least one pad. The second conductive via 31 is electrically connected to and contacts the first region 2a of the first circuit layer 2 (e.g., the first patterned layer 23 of the first circuit layer 2), and the second conductive via 31 is disposed in the second passivation layer 16. The second conductive via 31 and the second patterned layer 33 may be formed integrally and concurrently. The second patterned layer 33 is electrically connected to the first region 2a of the first circuit layer 2 (e.g., the first patterned layer 23 of the first circuit layer 2) through the second conductive via 31. A ratio of line width/line space (L/S) of the second circuit layer 3 may be less than, for example, about 7 µm/7 µm, about 5 µm/5 µm, or about 2 µm/2 µm.

As shown in FIG. 1, the second circuit layer 3 includes a second seed layer 30 and a second metal layer 36. The second seed layer 30 is disposed on the first region 2a of the first circuit layer 2 in the second opening 163 on the second passivation layer 16, and the second metal layer 36 is disposed on the second seed layer 30. In some embodiments, the second seed layer 30 may be a two-layered structure, and may include a lower layer 32 and an upper layer 34. The material of the lower layer 32 may be titanium (Ti), the material of the upper layer 34 may be copper (Cu), and the material of the second metal layer 36 may be copper (Cu).

It is noted that the second conductive via 31 may include the second seed layer 30 and the second metal layer 36, and the second patterned layer 33 may also include the second seed layer 30 and the second metal layer 36. Further, the lower layer 32 has a lateral surface 321, and the upper layer 34 has a lateral surface 341. The lateral surface 321 of the lower layer 32 may not be coplanar with the lateral surface 341 of the upper layer 34.

As shown in FIG. 1, the second light absorbing layer 38 is disposed on the second circuit layer 3. In some embodiments, the second light absorbing layer 38 is a black or brown layer that can absorb most or all light beams that are emitted by a radiation source (e.g., UV source) and reach the second light absorbing layer 38. In some embodiments, the second light absorbing layer 38 is an oxide layer that is an oxidized portion of the second circuit layer 3. Thus, the second light absorbing layer 38 is disposed on a top surface 361 and a lateral surface 362 of the second metal layer 36 of the second circuit layer 3. It is understood that the second light absorbing layer 38 may be included as a portion of the second circuit layer 3, or the second light absorbing layer 38 may be an additional layer that is attached or formed on the second circuit layer 3. It is noted that a material of the second light absorbing layer 38 may be the same as or different from a material of the first light absorbing layer 28.

The second light absorbing layer 38 extends to at least a portion of a lateral surface of the second seed layer 30. In some embodiments, the second light absorbing layer 38 may cover the entire lateral surface of the second seed layer 30. However, in the embodiment illustrated in FIG. 1, the second light absorbing layer 38 extends to and covers the lateral surface 341 of the upper layer 34 of the second seed layer 30. The lateral surface 321 of the lower layer 32 of the second seed layer 30 is exposed from the second light absorbing layer 38. That is, in some embodiments, the second light absorbing layer 38 does not extend to or cover the lateral surface 321 of the lower layer 32 of the second seed layer 30. As shown in FIG. 1, the lateral surface 362 of the second metal layer 36 is substantially coplanar with the lateral surface 341 of the upper layer 34 of the second seed layer 30, both of which are not coplanar with the lateral surface 321 of the lower layer 32 of the second seed layer 30. A lateral surface 382 of the second light absorbing layer 38 is substantially coplanar with the lateral surface 321 of the lower layer 32 of the second seed layer 30. The second light absorbing layer 38 may contact a portion of the top surface of the lower layer 32 of the second seed layer 30.

In some embodiments, the surface roughness of the second light absorbing layer 38 may be greater than the surface roughness of the first surface 161 of the second passivation layer 16 so as to increase the bonding force or attaching force between the third passivation layer 18 and the second light absorbing layer 38 (and the second circuit layer 3), and reduce the risk of the delamination between the third passivation layer 18 and the second light absorbing layer 38 (and the second circuit layer 3), which improves the yield rate of the semiconductor device 1. Further, in some embodiments, the second light absorbing layer 38 has a dark or black color, whereas the second passivation layer 16 and the third passivation layer 18 are substantially transparent. The second light absorbing layer 38 can be observed for positioning and defect detecting through the transparent passivation layers 16 and 18.

As shown in FIG. 1, the second light absorbing layer 38 may define at least one second through hole 381. The second through hole 381 extends through the second light absorbing layer 38 so as to expose a region 3a of the second circuit layer 3.

The third passivation layer 18 is disposed on and covers the first surface 161 of the second passivation layer 16 and the second light absorbing layer 38. The third passivation layer 18 may include, or be formed from, a photoresist layer, a cured photo sensitive material, a cured photoimageable dielectric (PID) material such as epoxy or polyimide (PI) including photoinitiators, or a combination of two or more thereof. The third passivation layer 18 can be provided in a film form or in a liquid form. For example, the third passivation layer 18 can be formed from a "positive" acting material or a "negative" acting photoimageable material, such as epoxy resins or acrylic resins.

The material of the third passivation layer 18 may be the same as or different from the material of the second passivation layer 16. The third passivation layer 18 has a first surface 181 and a second surface 182 opposite to the first surface 181, and defines at least one third opening 183. In some embodiments, the second surface 182 of the third passivation layer 18 contacts the first surface 161 of the second passivation layer 16 directly so as to enhance the adhesion therebetween. Further, the third opening 183 of the third passivation layer 18 extends through the third passivation layer 18, and corresponds to the second through hole 381 of the second light absorbing layer 38 so as to expose the region 3a of the second circuit layer 3.

In some embodiments, during a manufacturing process, the second light absorbing layer 38 can absorb most or all light beams that reach the second light absorbing layer 38. Thus, the original light beams radiating upon the third passivation layer 18 are not influenced by light beams reflected by the second light absorbed layer 28. No nodule is formed. Therefore, the third opening 183 of the third passivation layer 18 can be formed precisely without defects even when the diameter of the third opening 183 is very small.

Each of the bump pads 4 is disposed in a respective third opening 183 defined by the third passivation layer 18 and the second through hole 381 of the second light absorbing layer 38, and on the region 3a of the second circuit layer 3. The bump pads 4 may protrude from the first surface 181 of the third passivation layer 18. The bump pad 4 may include a plurality of metal layers. As shown in FIG. 1, the bump pad 40 includes a third seed layer 42, a third metal layer 44, a fourth metal layer 46 and a fifth metal layer 48. The material of the third seed layer 42 may include, for example, titanium-copper (Ti—Cu) alloy. The material of the third metal layer 44 may include, for example, copper (Cu). The material of the fourth metal layer 46 may include, for example, nickel (Ni). The material of the fifth metal layer 48 may include, for example, gold (Au). Other materials may additionally or alternatively be used for the metal layers. The third metal layer 44, the fourth metal layer 46 and the fifth metal layer 48 may be formed by, e.g., sputtering and plating, and thus, can have a low thickness. In one or more embodiments, the material of the fifth metal layer 48 may include, for example, tin (Sn), and the bump pad 4 may further include a silver layer on the tin layer. A bottom portion (including the third seed layer 42 and the third metal layer 44) of the bump pad 4 in the third opening 183 of the third passivation layer 18 may contact and electrically connect to the region 3a of the second circuit layer 3.

Each of the external connectors 5 (e.g., solder balls) is disposed on the fifth metal layer 48 of a respective bump pad 4 for external connection. In some embodiments, the external connector 5 may be substantially in a hemisphere shape. In some embodiments, a height of the external connector 5 may be reduced for using in, e.g., a land grid array (LGA).

According to at least some embodiments of the present disclosure, as shown in the embodiment illustrated in FIG. 1, since at least a part of the first metal layer 26 of the first circuit layer 2 is covered by the first light absorbing layer 28, no light beams or a small amount of light beams are reflected by the first light absorbing layer 28. Thus, light beams reflected by the first metal layer 26 of the first circuit layer 2 may be reduced or avoided. Accordingly, nodules of the second passivation layer 16 in the second opening 163 may be reduced or avoided, and the yield rate of the second conductive via 31 may be improved by, e.g., more than about 30%, more than about 40%, more than about 50%, more than about 60%, or more than about 70%.

Figure 2:
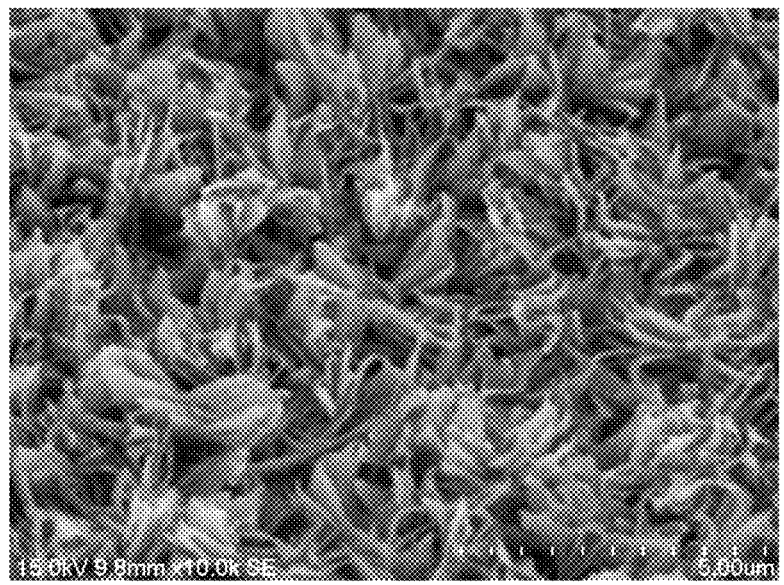
FIG. 2 illustrates a scanning electron microscope (SEM) image of a top surface of a first light absorbing layer of FIG. 1.

FIG. 2 illustrates a scanning electron microscope (SEM) image of the top surface of the first light absorbing layer 28 of FIG. 1. The first light absorbing layer 28 has a trichome shape microstructure on the top surface thereof. Thus, the top surface of the first light absorbing layer 28 may have a surface roughness (Ra) of, e.g., about 100 nm to about 400 μm, about 200 nm to about 500 nm, or about 100 nm to about 500 nm. In comparison, the first surface 141 of the first passivation layer 14 may have a surface roughness (Ra) of, e.g., about 1 nm to about 100 nm, about 2 nm to about 50 nm, about 5 nm to about 30 nm, or about 8 nm to about 26 nm. Therefore, the surface roughness of the first light absorbing layer 28 is greater than the surface roughness of the first passivation layer 14. Similarly, the surface roughness of the second light absorbing layer 38 is greater than the surface roughness of the second passivation layer 16.

Figure 3:
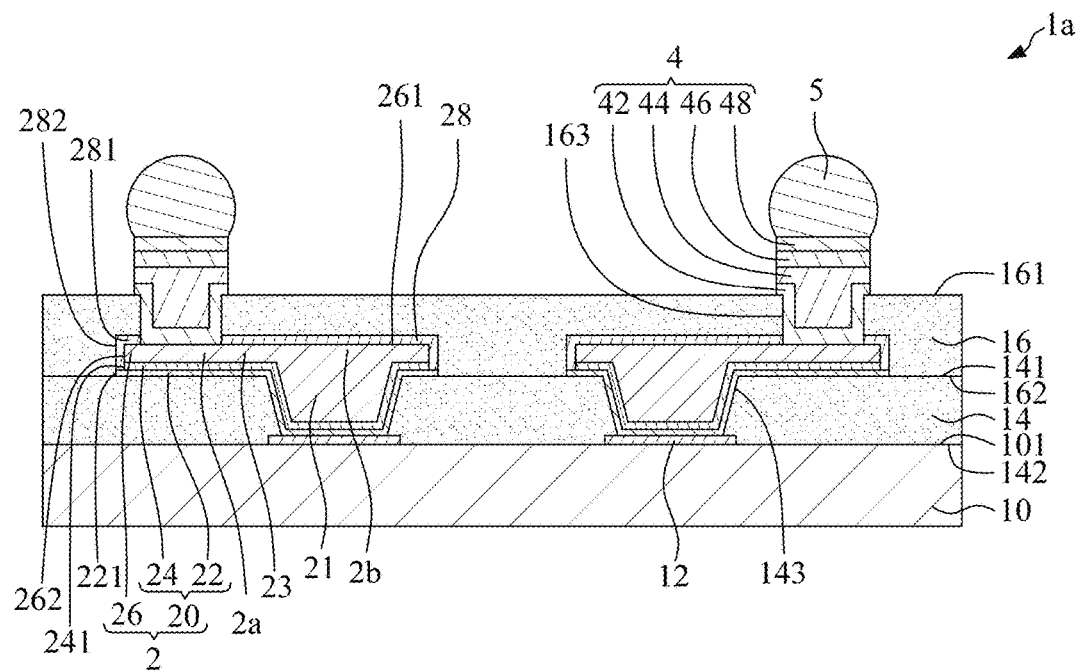
FIG. 3 illustrates a cross-sectional view of an example of a semiconductor device according to some embodiments of the present disclosure.

FIG. 3 illustrates a cross-sectional view of an example of a semiconductor device 1a according to some embodiments of the present disclosure. The semiconductor device 1a of FIG. 3 is similar to the semiconductor device 1 as shown in FIG. 1, except that the second circuit layer 3 and the third passivation layer 18 are omitted. Each of the bump pads 4 is disposed on the first region 2a of the first circuit layer 2 in the second opening 163 of the second passivation layer 16 and the first through hole 281 of the first light absorbing layer 28. The bump pads 4 may protrude from the first surface 161 of the second passivation layer 16.

Figure 4:
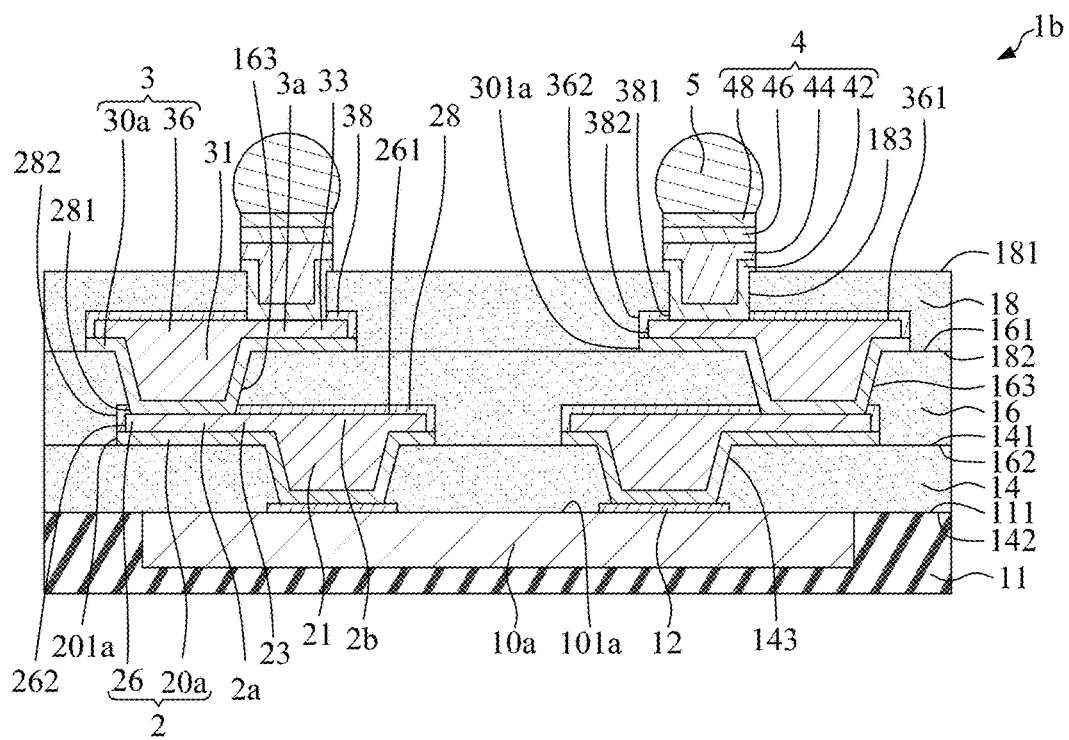
FIG. 4 illustrates a cross-sectional view of an example of a semiconductor device according to some embodiments of the present disclosure.

FIG. 4 illustrates a cross-sectional view of an example of a semiconductor device 1b according to some embodiments of the present disclosure. The semiconductor device 1b of FIG. 4 is similar to the semiconductor device 1 as shown in FIG. 1, except for the structures of the base element 10a, the first seed layer 20a and the second seed layer 30a. As shown in FIG. 4, the base element 10a is a semiconductor die. The semiconductor device 1b further includes an encapsulant 11 covering the base element 10a and the first passivation layer 14. In some embodiments, a first surface 101a of the base element 10a is substantially coplanar with a first surface 111 of the encapsulant 11, both of which are in contact with the second surface 142 of the first passivation layer 14.

The first seed layer 20a is a single layered structure, and may include, e.g., titanium-copper (Ti—Cu) alloy. The first light absorbing layer 28 does not extend to or cover the lateral surface 201a of the first seed layer 20a. The first light absorbing layer 28 may contact at least a portion of the top surface of the first seed layer 20a. The lateral surface 282 of the first light absorbing layer 28 may be substantially coplanar with the lateral surface 201a of the first seed layer 20a. Similarly, the second seed layer 30a is a single layered structure, and may include, e.g., titanium-copper (Ti—Cu) alloy. The second light absorbing layer 38 does not extend to or cover the lateral surface 301a of the second seed layer 30a. The second light absorbing layer 38 may contact a portion of the top surface of the second seed layer 30a, and the lateral surface 382 of the second light absorbing layer 38 may be substantially coplanar with the lateral surface 301a of the second seed layer 30a.

Figure 5:
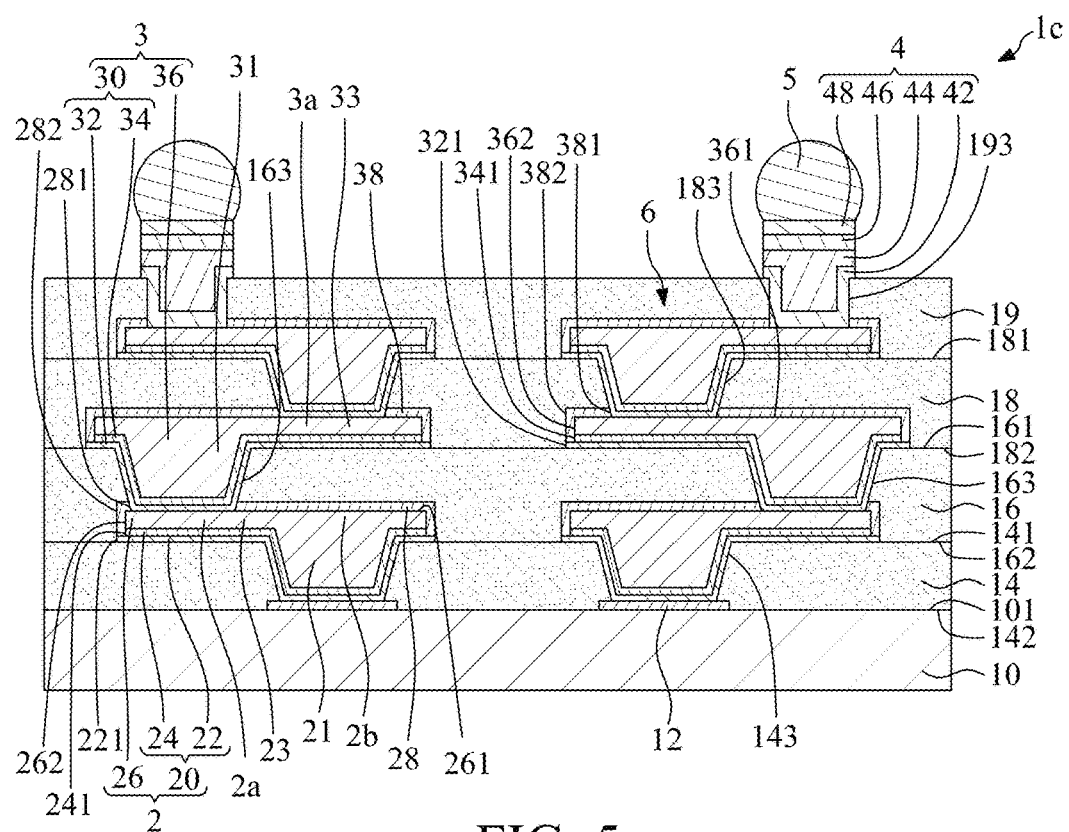
FIG. 5 illustrates a cross-sectional view of an example of a semiconductor device according to some embodiments of the present disclosure.

FIG. 5 illustrates a cross-sectional view of an example of a semiconductor device 1c according to some embodiments of the present disclosure. The semiconductor device 1c of FIG. 5 is similar to the semiconductor device 1 as shown in FIG. 1, except that the semiconductor device 1c further includes a third circuit layer 6 and a fourth passivation layer 19. The third circuit layer 6 is disposed in the third opening 183 of the third passivation layer 18 and on the third passivation layer 18 so as to electrically connect the second circuit layer 3. The fourth passivation layer 19 is disposed on and covers the third passivation layer 18 and the third circuit layer 6. Each of the bump pads 4 is disposed in a respective fourth opening 193 defined by the fourth passivation layer 19, and on the third circuit layer 6.

Figure 6:
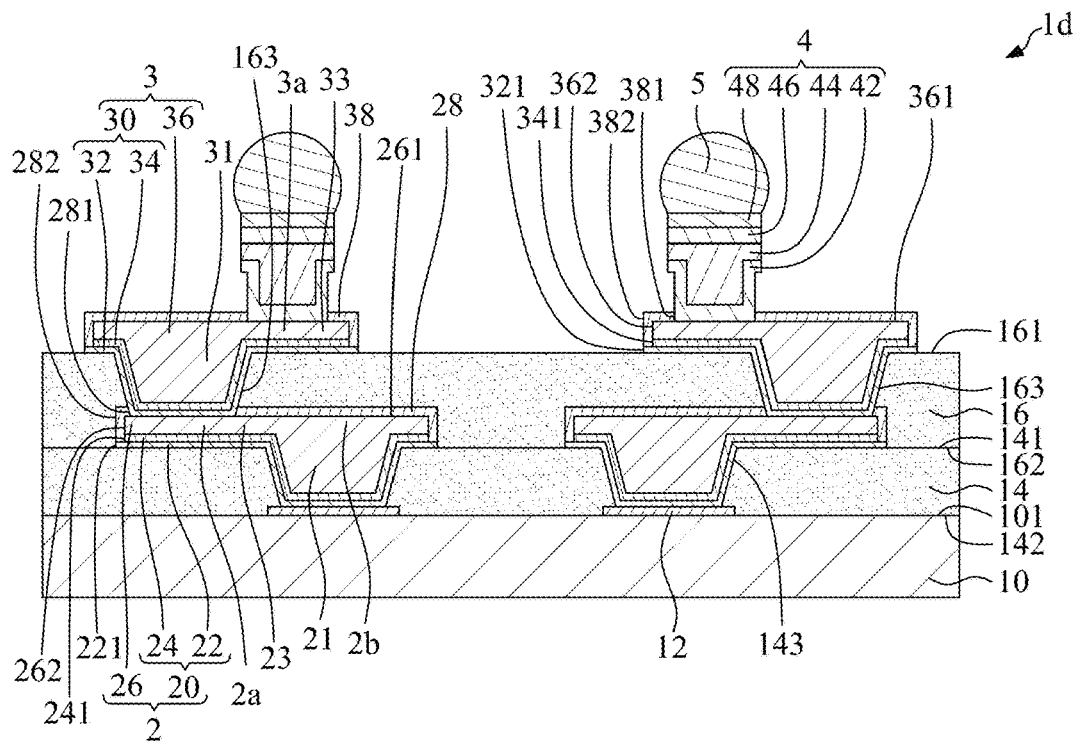
FIG. 6 illustrates a cross-sectional view of an example of a semiconductor device according to some embodiments of the present disclosure.

FIG. 6 illustrates a cross-sectional view of an example of a semiconductor device 1d according to some embodiments of the present disclosure. The semiconductor device 1d of FIG. 6 is similar to the semiconductor device 1 as shown in FIG. 1, except that the third passivation layer 18 is omitted.

Figure 7:
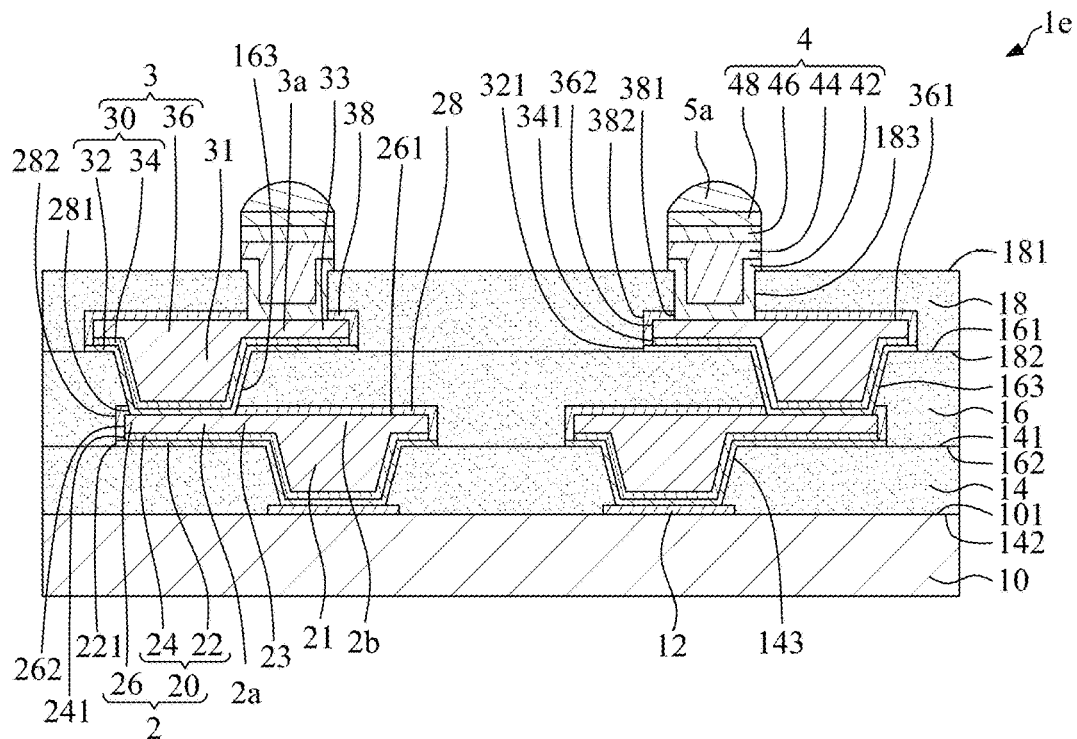
FIG. 7 illustrates a cross-sectional view of an example of a semiconductor device according to some embodiments of the present disclosure.

FIG. 7 illustrates a cross-sectional view of an example of a semiconductor device 1e according to some embodiments of the present disclosure. The semiconductor device 1e of FIG. 7 is similar to the semiconductor device 1 as shown in FIG. 1, except that a height of the external connector 5a may be reduced for using in, e.g., a land grid array (LGA).

Figure 8:
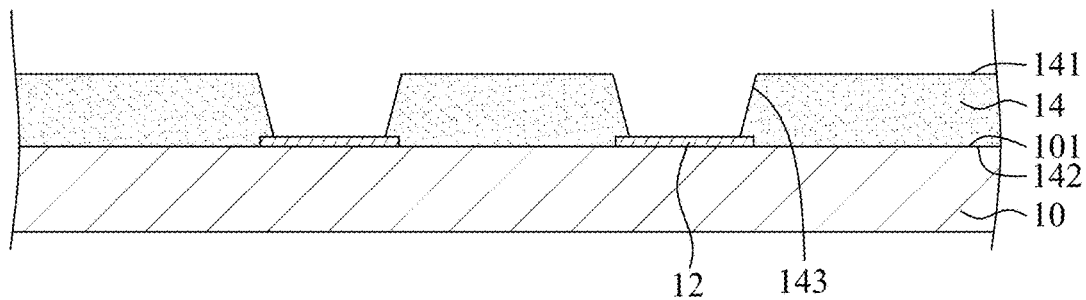
FIG. 8 illustrates one or more stages of an example of a method for manufacturing a semiconductor device according to some embodiments of the present disclosure.

FIG. 8 to FIG. 31 illustrate various stages of an example of a method for manufacturing a semiconductor device according to some embodiments of the present disclosure. In the illustrated embodiments, the method is used to manufacture semiconductor device such as the semiconductor device 1 shown in FIG. 1 and FIG. 1A. Referring to FIG. 8, at least one base element 10 is provided. The base element 10 may be a substrate or a semiconductor wafer, and includes a first surface 101 and at least one conductive pad 12 adjacent to the first surface 101. The material of the base element 10 may include, for example, a semiconductor material (e.g., silicon), glass, ceramic, organic material, metal (e.g., Cu, Ni, a combination of Ag— and Sn, and Pd), or a combination of two or more thereof.

Then, at least one passivation layer (e.g., a first passivation layer 14) is formed on the base element 10 by, for example, coating. In some embodiments, the first passivation layer 14 is formed on and covers the first surface 101 of the base element 10. The first passivation layer 14 may include, or be formed from, a photoresist layer, a cured photo sensitive material, a cured photoimageable dielectric (PID) material such as epoxy or polyimide (PI) including photoinitiators, or a combination of two or more thereof. The first passivation layer 14 can be provided in a film form or in a liquid form. For example, the first passivation layer 14 can be formed from a "positive" acting material or a "negative" acting photoimageable material, such as epoxy resins or acrylic resins. The first passivation layer 14 has a first surface 141 and a second surface 142 opposite to the first surface 141. In some embodiments, the second surface 142 of the first passivation layer 14 contacts the first surface 101 of the base element 10.

Then, at least one first opening 143 is formed in the first passivation layer 14. The first opening 143 extends through the first passivation layer 14 so as to expose a portion (e.g., the conductive pad 12) of the base element 10.

Figure 9:
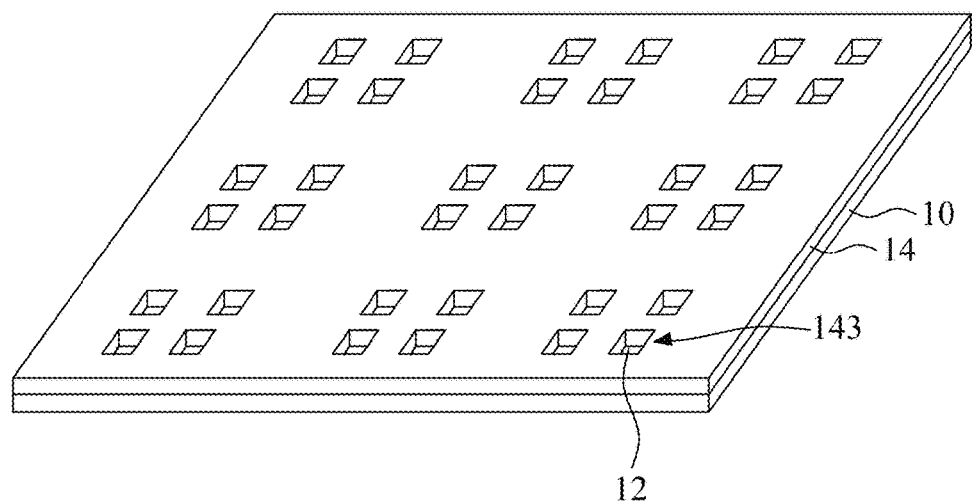
FIG. 9 illustrates a schematic perspective view of a base element and a first passivation layer depicted in FIG. 8 according to some embodiments of the present disclosure.

FIG. 9 illustrates a schematic perspective view of the base element 10 and the first passivation layer 14 depicted in FIG. 8 according to some embodiments of the present disclosure. The shape of the base element 10 may be, e.g., rectangular or square.

Figure 10:
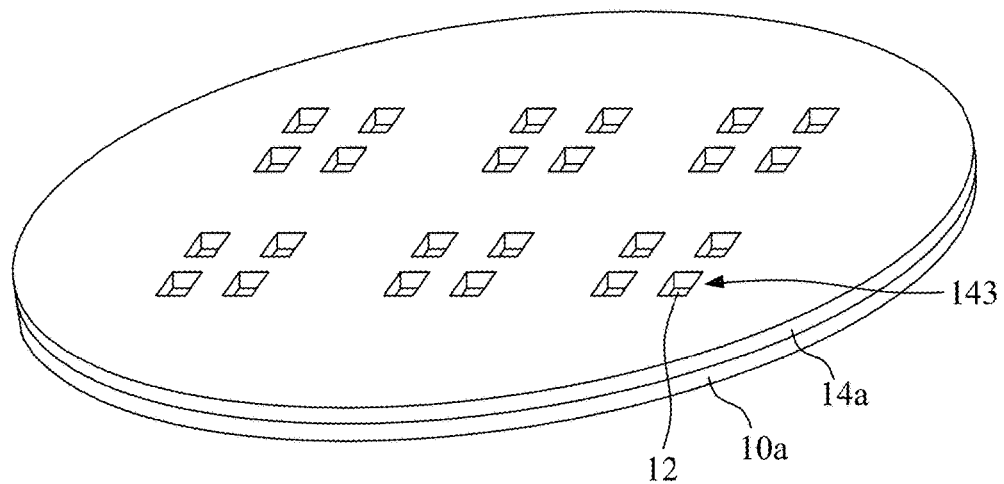
FIG. 10 illustrates a schematic perspective view of a base element and a first passivation layer according to some embodiments of the present disclosure.

FIG. 10 illustrates a schematic perspective view of the base element 10a and the first passivation layer 14a according to some embodiments of the present disclosure. The shape of the base element 10a may be, e.g., circular or elliptical.

Figure 11:
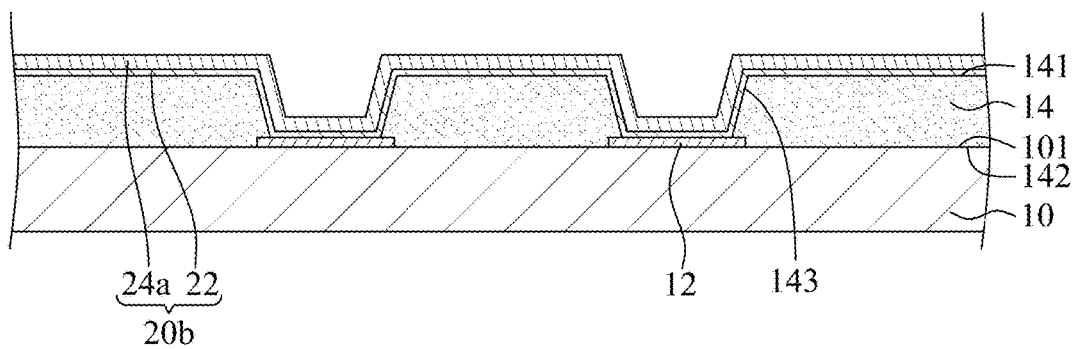
FIG. 11 illustrates one or more stages of an example of a method for manufacturing a semiconductor device according to some embodiments of the present disclosure.

Referring to FIG. 11, at least one first conductive layer (e.g., a seed layer 20b) is formed in the passivation layer (e.g., the first passivation layer 14) to electrically connect the base element 10. In some embodiments, the first conductive layer may be the seed layer 20b. The seed layer 20b is formed on the conductive pad 12 of the base element 10 in the first opening 143 of the first passivation layer 14 by, for example, physical vapor deposition (PVD), so as to electrically connect the base element 10. Further, the seed layer 20b is also formed on the first surface 141 of the first passivation layer 14. In some embodiments, the seed layer 20b may be a two-layered structure, and may include a lower layer 22 and a top layer 24a. The material of the lower layer 22 may be titanium (Ti), and the material of the top layer 24a may be copper (Cu).

Figure 12:
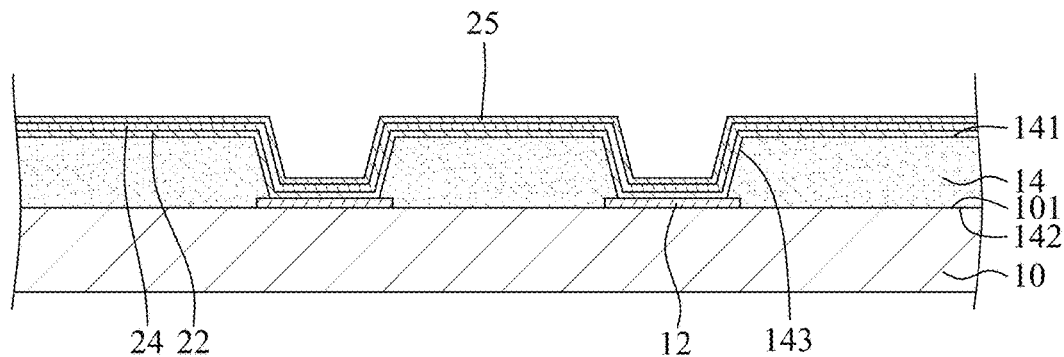
FIG. 12 illustrates one or more stages of an example of a method for manufacturing a semiconductor device according to some embodiments of the present disclosure.

Referring to FIG. 12, a light absorbing layer 25 is formed on the top layer 24a of the first conductive layer (e.g., the seed layer 20b). In some embodiments, the light absorbing layer 25 is a black or brown layer that can absorb most or all light beams that are emitted by a radiation source (e.g., UV source) and reach the light absorbing layer 25. That is, few or no light beams are reflected by the light absorbing layer 25. In some embodiments, a top portion of the top layer 24a of the seed layer 20b is oxidized to form the light absorbing layer 25. Such oxidation process can be performed by, e.g., applying a chemical reaction mixture (e.g., a mixture of hydrochloric acid (HCl) and sulfuric acid ($H_2SO_4$)) to a top surface of the top layer 24a of the seed layer 20b, which may be a black or brown oxide pretreatment. Thus, the light absorbing layer 25 is an oxide layer (e.g., copper oxide). Further, a bottom portion of the top layer 24a of the seed layer 20b is not oxidized and becomes an upper layer 24 that has the same material as the top layer 24a such as copper. Thus, the light absorbing layer 25 is disposed on the upper layer 24. It is understood that the light absorbing layer 25 may be included as a portion of the first conductive layer (e.g., the seed layer 20b), or the light absorbing layer 25 may be an additional layer that is attached or formed on the first conductive layer (e.g., the seed layer 20b).

Figure 13:
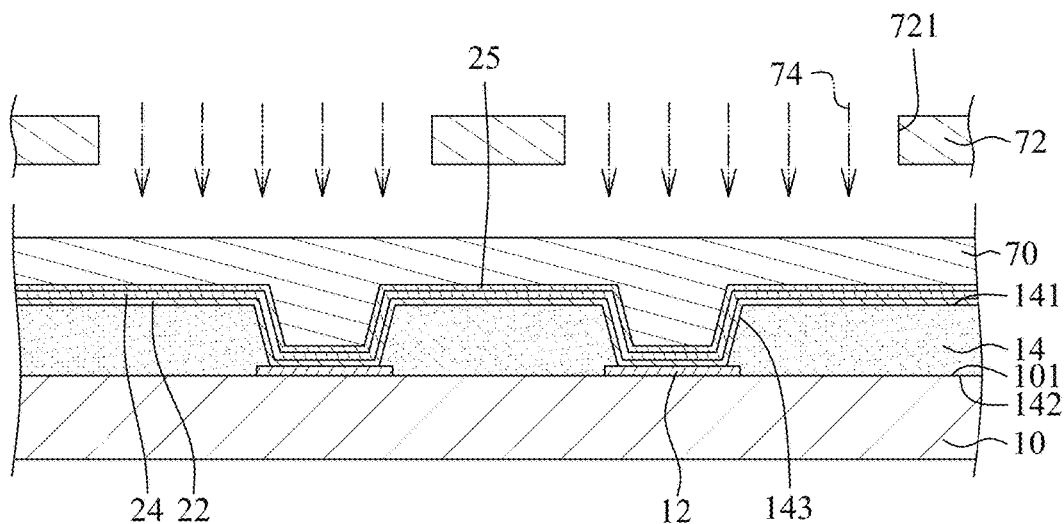
FIG. 13 illustrates one or more stages of an example of a method for manufacturing a semiconductor device according to some embodiments of the present disclosure.

Referring to FIG. 13, a first photoresist layer 70 is applied on the light absorbing layer 25 by, for example, coating. The first photoresist layer 70 can be formed from, e.g., a "positive" acting material. A first photomask 72 is applied above the first photoresist layer 70. The first photomask 72 defines at least one through hole 721 which extends through the first photomask 72. Light beams 74 emitted from a radiation source (e.g., UV source) are applied to the first photoresist layer 70 through the through hole 721 of the first photomask 72. That is, a portion of the first photoresist layer 70 corresponding to (e.g., under) the through hole 721 of the first photomask 72 is radiated by the light beams 74, and is an exposed portion which becomes dissolvable to a developer (e.g., an organic solvent). The other portion of the first photoresist layer 70 corresponding to (e.g., under) the solid portion of the first photomask 72 is not radiated by the light beams 74, and is an unexposed portion which is insoluble in the developer.

During such exposure process, the light absorbing layer 25 which is disposed under the first photoresist layer 70 is a black or brown layer that can absorb most or all light beams that reach the light absorbing layer 25. That is, few or no light beams 74 are reflected back to the first photoresist layer 70 by the light absorbing layer 25. Thus, the light beams 74 along the original downward path radiating upon the first photoresist layer 70 are not influenced by the reflected light beams. As a result, the exposed portion of the first photoresist layer 70 can be formed precisely without defects even when a size of the exposed portion is very small.

Figure 14:
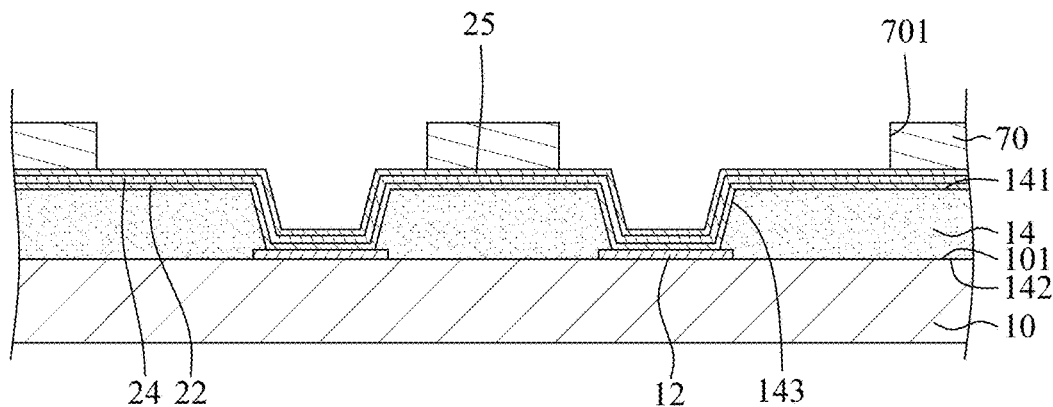
FIG. 14 illustrates one or more stages of an example of a method for manufacturing a semiconductor device according to some embodiments of the present disclosure.

Referring to FIG. 14, the first photomask 72 is removed. A development process is conducted by applying a developer to the first photoresist layer 70 so as to dissolve and remove the exposed portion of the first photoresist layer 70. Thus, at least one through hole 701 that extends through the first photoresist layer 70 is formed. The size and position of the through hole 701 of the first photoresist layer 70 corresponds to the size and position of the through hole 721 of the first photomask 72 (FIG. 13). The through hole 701 of the first photoresist layer 70 is communicated with the first opening 143 of the first passivation layer 14, so that a portion of the light absorbing layer 25 is exposed from the through hole 701 of the first photoresist layer 70. It is noted that since the exposed portion of the first photoresist layer 70 can be formed precisely without defects, there is no nodule formed in the through hole 701 of the first photoresist layer 70. As a result, the through hole 701 of the first photoresist layer 70 can be formed precisely without defects.

Figure 15:
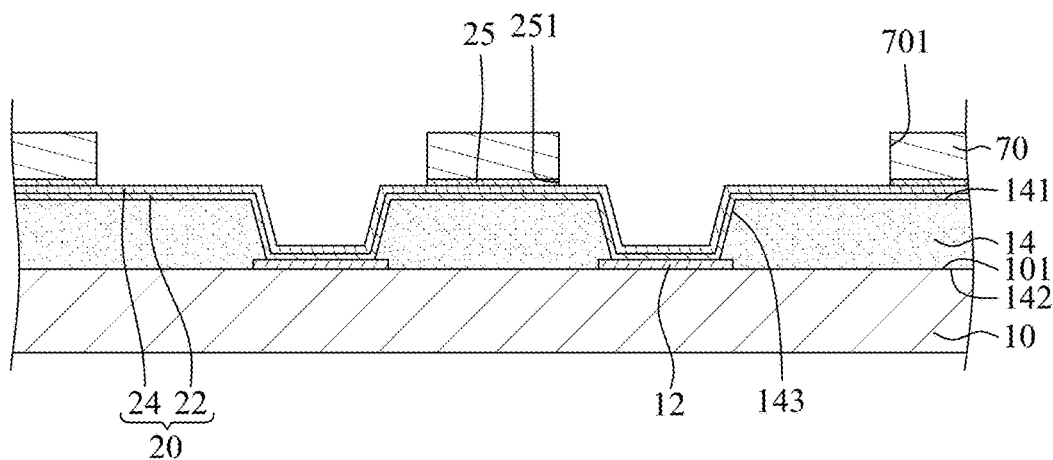
FIG. 15 illustrates one or more stages of an example of a method for manufacturing a semiconductor device according to some embodiments of the present disclosure.

Referring to FIG. 15, a surface flashing etching process is performed on the light absorbing layer 25, with the first photoresist layer 70 serving as a mask. A through hole 251 is formed on the light absorbing layer 25 at a position corresponding to the through hole 701 of the first photoresist layer 70, and extends through the light absorbing layer 25. A portion of the top surface of the upper layer 24 is exposed in the through hole 251. Meanwhile, the seed layer 20b in the through hole 251 of the light absorbing layer 25 becomes the first seed layer 20 that is a two-layered structure including the lower layer 22 and the upper layer 24.

Figure 16:
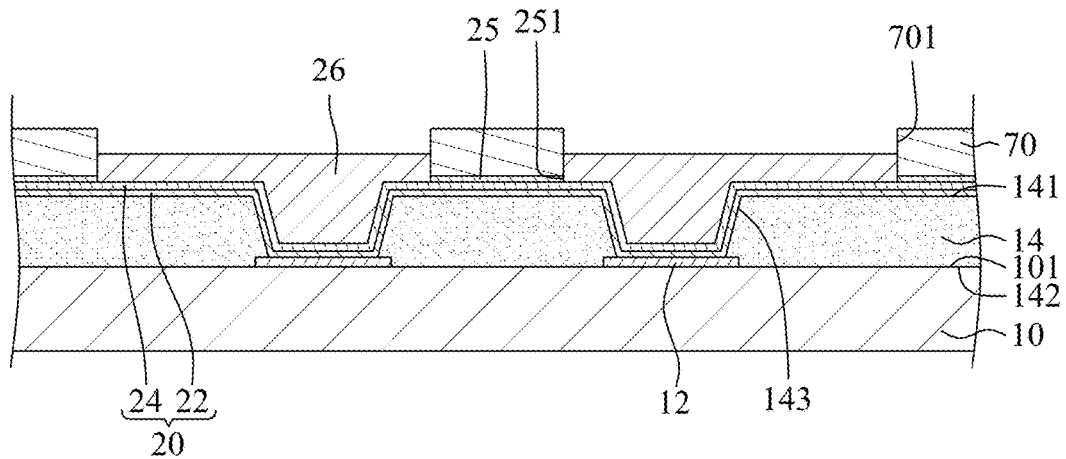
FIG. 16 illustrates one or more stages of an example of a method for manufacturing a semiconductor device according to some embodiments of the present disclosure.

Referring to FIG. 16, at least one second conductive layer (e.g., a first metal layer 26) is formed on the upper layer 24 of the first seed layer 20 in the through hole 251 of the light absorbing layer 25 and the through hole 701 of the first photoresist layer 70 so as to electrically connect the first conductive layer (e.g., the first seed layer 20). The material of the first metal layer 26 may be copper (Cu).

Figure 17:
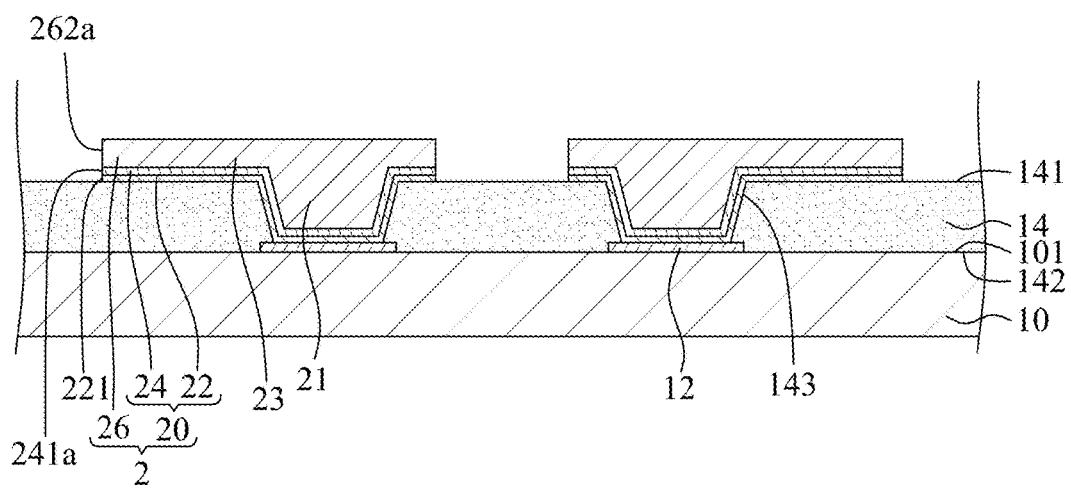
FIG. 17 illustrates one or more stages of an example of a method for manufacturing a semiconductor device according to some embodiments of the present disclosure.

Referring to FIG. 17, the first photoresist layer 70 is then removed by, for example, stripping. Then, a partial flashing etching process is performed on the seed layer 20b (including the light absorbing layer 25, the upper layer 24 and the lower layer 22), with the first metal layer 26 serving as a mask. A first circuit layer 2 can be formed concurrently. The first circuit layer 2 is disposed on the conductive pad 12 of the base element 10 in the first opening 143 of the first passivation layer 14 and on the first passivation layer 14. In some embodiments, a portion of the first circuit layer 2 is disposed in the first opening 143 of the first passivation layer 14 so to form a first conductive via 21, and the other portion of the first circuit layer 2 is disposed on the first surface 141 of the first passivation layer 14 so as to form a first patterned layer 23 which may include at least one trace and/or at least one pad. The first conductive via 21 is electrically connected to and contacts the conductive pad 12 of the base element 10, and the first conductive via 21 is disposed in the first passivation layer 14. The first conductive via 21 and the first patterned layer 23 may be formed integrally and concurrently, and the first patterned layer 23 is electrically connected to the conductive pad 12 of the base element 10 through the first conductive via 21.

As shown in FIG. 17, the first circuit layer 2 includes the first seed layer 20 and the first metal layer 26. The first seed layer 20 is disposed on the conductive pad 12 of the base element 10 in the first opening 143 and on the first passivation layer 14, and the first metal layer 26 is disposed on the first seed layer 20. It is noted that the first conductive via 21 may include the first seed layer 20 and the first metal layer 26, and the first patterned layer 23 may also include the first seed layer 20 and the first metal layer 26. Further, the lateral surface 221 of the lower layer 22, the lateral surface 241a of the upper layer 24 and the lateral surface 262a of the first metal layer 26 are substantially coplanar with each other.

Figure 18:
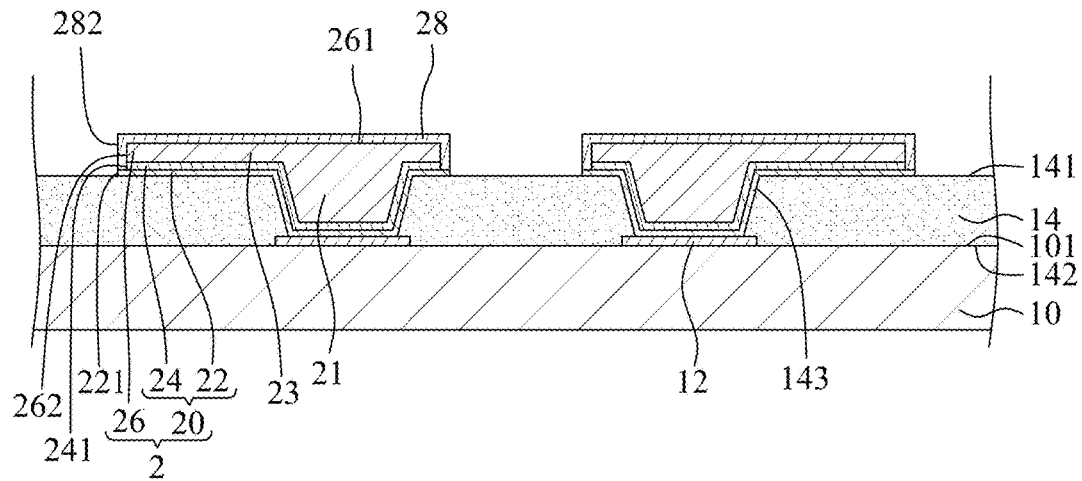
FIG. 18 illustrates one or more stages of an example of a method for manufacturing a semiconductor device according to some embodiments of the present disclosure.

Referring to FIG. 18, a first light absorbing layer 28 is formed on the first circuit layer 2. In some embodiments, the first light absorbing layer 28 is a black or brown layer that can absorb most or all light beams that are emitted by a radiation source (e.g., UV source) and reach the first light absorbing layer 28. In some embodiments, a top surface and the lateral surface 262a of the first metal layer 26 is oxidized to form the first light absorbing layer 28. Such oxidation process can be performed by, e.g., applying a chemical reaction mixture (e.g., a mixture of hydrochloric acid (HCl) and sulfuric acid ($H_2SO_4$)), which is a black or brown oxide pretreatment. Thus, the first light absorbing layer 28 is an oxide layer (e.g., copper oxide). After the oxidation process, the first light absorbing layer 28 is disposed on a top surface 261 and a lateral surface 262 of the first metal layer 26 of the first circuit layer 2. It is understood that the first light absorbing layer 28 may be included as a portion of the first circuit layer 2, or the first light absorbing layer 28 may be an additional layer that is attached or formed on the first circuit layer 2.

As shown in FIG. 18, the lateral surface 241a of the upper layer 24 may be oxidized concurrently. Thus, after the oxidation process, the first light absorbing layer 28 extends to and covers the lateral surface 241 of the upper layer 24 of the first seed layer 20. Further, the lower layer 22 is not oxidized, so that the lateral surface 221 of the lower layer 22 is exposed from the first light absorbing layer 28. That is, the first light absorbing layer 28 does not extend to or cover the lateral surface 221 of the lower layer 22. As shown in FIG. 18, the lateral surface 262 of the first metal layer 26 is substantially coplanar with the lateral surface 241 of the upper layer 24, both of which are not coplanar with the lateral surface 221 of the lower layer 22. A lateral surface 282 of the first light absorbing layer 28 is substantially coplanar with the lateral surface 221 of the lower layer 22. The first light absorbing layer 28 may contact a portion of the top surface of the lower layer 22. It is noted that the surface roughness of the first light absorbing layer 28 may be greater than the surface roughness of the first surface 141 of the first passivation layer 14. Further, in some embodiments, the first light absorbing layer 28 has a dark or black color, whereas the first passivation layer 14 is substantially transparent. Thus, the first light absorbing layer 28 can be observed for positioning and defect detecting though the transparent passivation layer 14.

Figure 19:
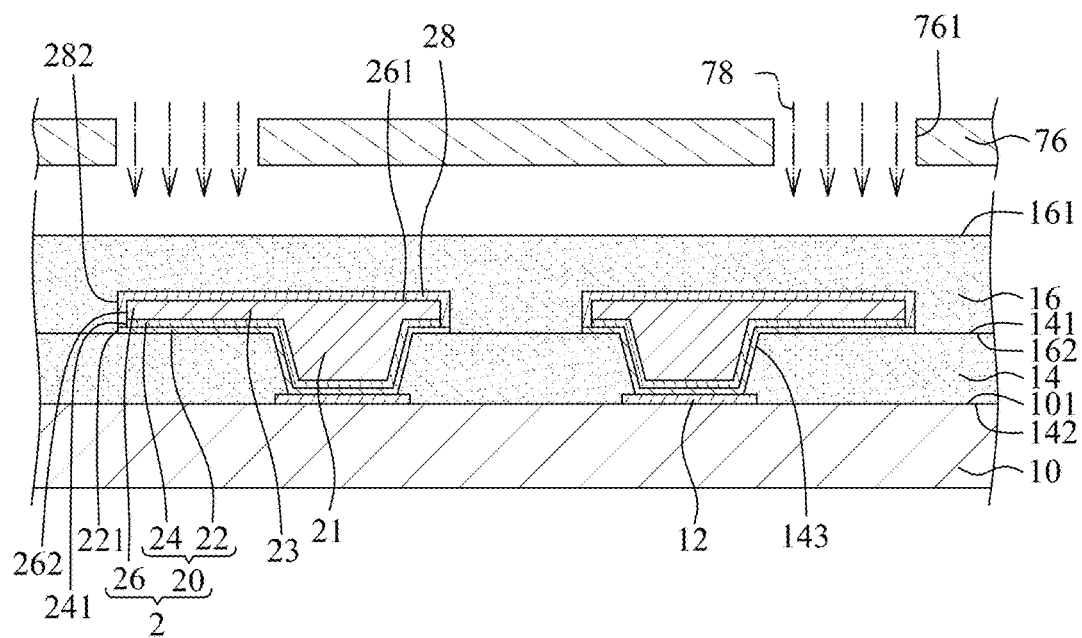
FIG. 19 illustrates one or more stages of an example of a method for manufacturing a semiconductor device according to some embodiments of the present disclosure.

Referring to FIG. 19, a second passivation layer 16 is formed on the first surface 141 of the first passivation layer 14 and the first light absorbing layer 28 (and the first circuit layer 2). The second passivation layer 16 may include, or be formed from, a photoresist layer, a cured photo sensitive material, a cured photoimageable dielectric (PID) material such as epoxy or polyimide (PI) including photoinitiators, or a combination of two or more thereof. The second passivation layer 16 can be provided in a film form or in a liquid form. For example, the second passivation layer 16 can be formed from a "positive" acting material or a "negative" acting photoimageable material, such as epoxy resins or acrylic resins. The material of the second passivation layer 16 may be the same as or different from the material of the first passivation layer 14. The second passivation layer 16 has a first surface 161 and a second surface 162 opposite to the first surface 161. In some embodiments, the second surface 162 of the second passivation layer 16 contacts the first surface 141 of the first passivation layer 14 directly so as to enhance the adhesion therebetween.

As stated above, the surface roughness of the first light absorbing layer 28 is greater than the surface roughness of the first surface 141 of the first passivation layer 14 so as to increase the bonding force or attaching force between the second passivation layer 16 and the first light absorbing layer 28 (and the first circuit layer 2), and reduce the risk of the delamination between the second passivation layer 16 and the first light absorbing layer 28 (and the first circuit layer 2), which improves the yield rate of the semiconductor device 1.

A second photomask 76 is provided above the second passivation layer 16. The second photomask 76 defines at least one through hole 761 which extends through the second photomask 76. Light beams 78 emitted from a radiation source (e.g., UV source) are applied to the second passivation layer 16 through the through hole 761 of the second photomask 76. That is, a portion of the second passivation layer 16 corresponding to (e.g., under) the through hole 761 of the second photomask 76 is radiated by the light beams 78, and is an exposed portion which becomes dissolvable to a developer (e.g., an organic solvent). The other portion of the second passivation layer 16 corresponding to (e.g., under) the solid portion of the second photomask 76 is not radiated by the light beams 78, and is an unexposed portion which becomes insoluble in the developer.

During such exposure process, the first light absorbing layer 28 is a black or brown layer that can absorb most or all light beams that reach the first light absorbing layer 28. That is, few or no light beams 78 are reflected back to the second passivation layer 16 by the first light absorbing layer 28. Thus, the light beams 78 along the original downward path radiating upon the second passivation layer 16 are not influenced by reflected light beams. As a result, the exposed portion of the second passivation layer 16 can be formed precisely without defects even when the size of the exposed portion is very small.

Figure 20:
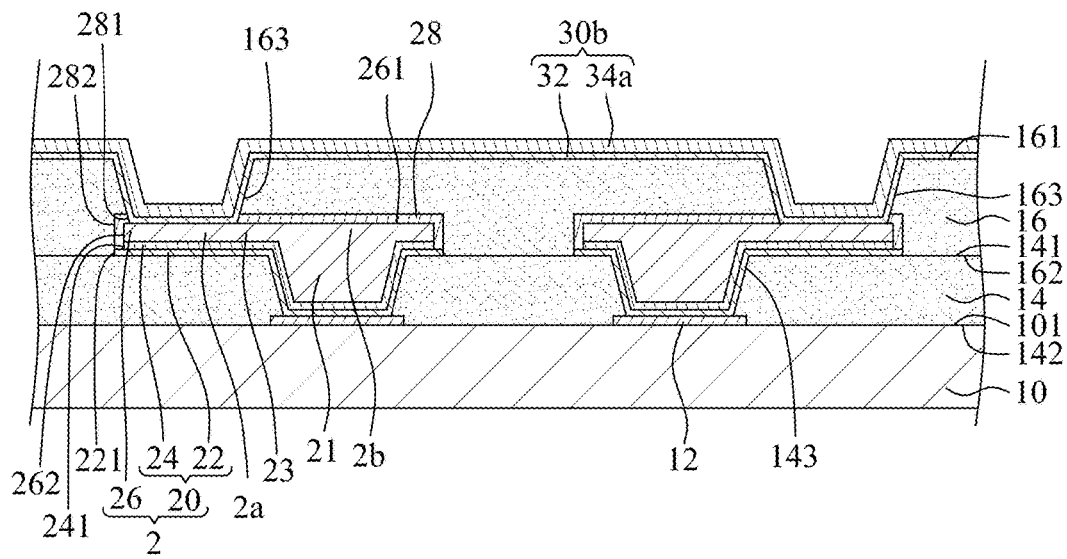
FIG. 20 illustrates one or more stages of an example of a method for manufacturing a semiconductor device according to some embodiments of the present disclosure.

Referring to FIG. 20, the second photomask 76 is removed. A development process is conducted by applying a developer to the second passivation layer 16 so as to dissolve and remove the exposed portion of the second passivation layer 16. Thus, at least one second opening 163 that extends through the second passivation layer 16 is formed. The size and position of the second opening 163 of the second passivation layer 16 corresponds to the size and position of the through hole 761 of the second photomask 76 (FIG. 19). Meanwhile, a part of the first light absorbing layer 28 is exposed from the second opening 163 of the second passivation layer 16. It is noted that since the exposed portion of the second passivation layer 16 can be formed precisely without defects, there is no nodule formed in the second opening 163 of the second passivation layer 16. As a result, the second opening 163 of the second passivation layer 16 can be formed precisely without defects.

A surface flashing etching process is performed on the first light absorbing layer 28, with the second passivation layer 16 serving as a mask. The exposed part of the first light absorbing layer 28 is removed so as to form at least one first through hole 281. The first through hole 281 is formed on the first light absorbing layer 28 at a position corresponding to the second opening 163 of the second passivation layer 16, and extends through the first light absorbing layer 28. A first region 2a of the first circuit layer 2 is exposed in the first through hole 281 of the first light absorbing layer 28. That is, the first region 2a of the first circuit layer 2 is uncovered by the first light absorbing layer 28. In addition, the first circuit layer 2 further includes a second region 2b covered by the first light absorbing layer 28. Since the first through hole 281 of the first light absorbing layer 28 is formed by etching, a surface roughness of the first region 2a of the first circuit layer 2 is greater than a surface roughness of the second region 2b of the first circuit layer 2.

A seed layer 30b is formed in the passivation layer (e.g., the second passivation layer 16) to electrically connect the first circuit layer 2. In some embodiments, the seed layer 30b is formed on the second region 2b of the first circuit layer 2 in the second opening 163 of the second passivation layer 16 and the first through hole 281 of the first light absorbing layer 28. Further, the seed layer 30b is also formed on the first surface 161 of the second passivation layer 16. In some embodiments, the seed layer 30b may be a two-layered structure, and may include a lower layer 32 and a top layer 34a. The material of the lower layer 32 may be titanium (Ti), and the material of the top layer 34a may be copper (Cu).

Figure 21:
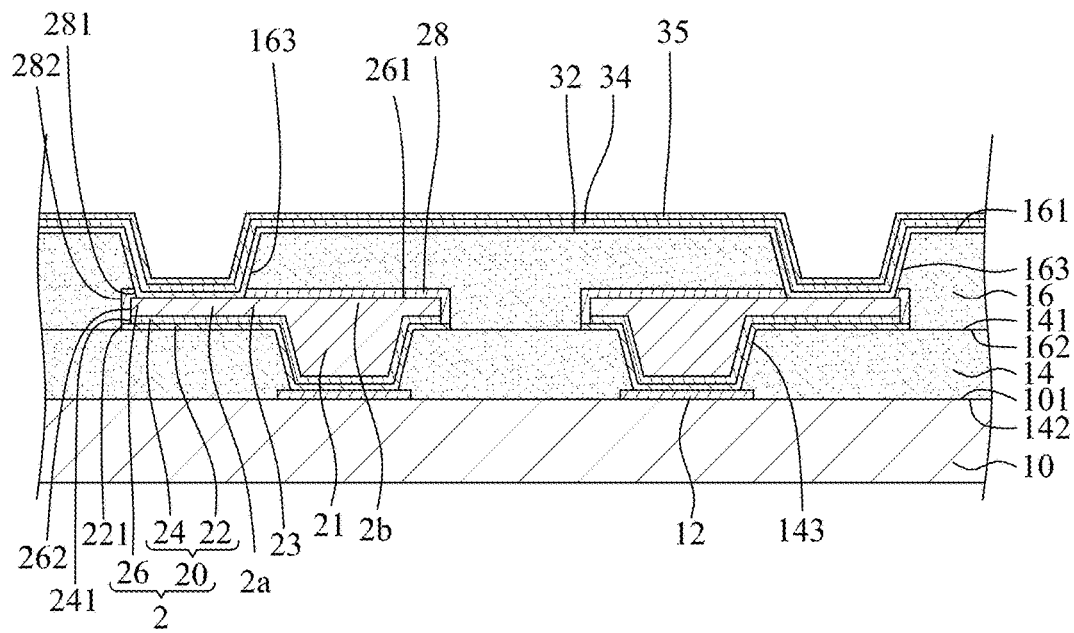
FIG. 21 illustrates one or more stages of an example of a method for manufacturing a semiconductor device according to some embodiments of the present disclosure.

Referring to FIG. 21, a light absorbing layer 35 is formed on the top layer 34a of the seed layer 30b. In some embodiments, the light absorbing layer 35 is a black or brown layer that can absorb most or all light beams that are emitted by a radiation source (e.g., UV source) and reach the light absorbing layer 35. That is, few or no light beams are reflected by the light absorbing layer 35. In some embodiments, a top portion of the top layer 34a of the seed layer 30b is oxidized to form the light absorbing layer 35. Thus, the light absorbing layer 35 is an oxide layer (e.g., copper oxide). Further, a bottom portion of the top layer 34a of the seed layer 30b is not oxidized and becomes an upper layer 34 that has the same material as the top layer 34a (such as copper). Thus, the light absorbing layer 35 is disposed on the upper layer 34. It is understood that the light absorbing layer 35 may be included as a portion of the seed layer 30b, or the light absorbing layer 35 may be an additional layer that is attached or formed on the seed layer 30b.

Figure 22:
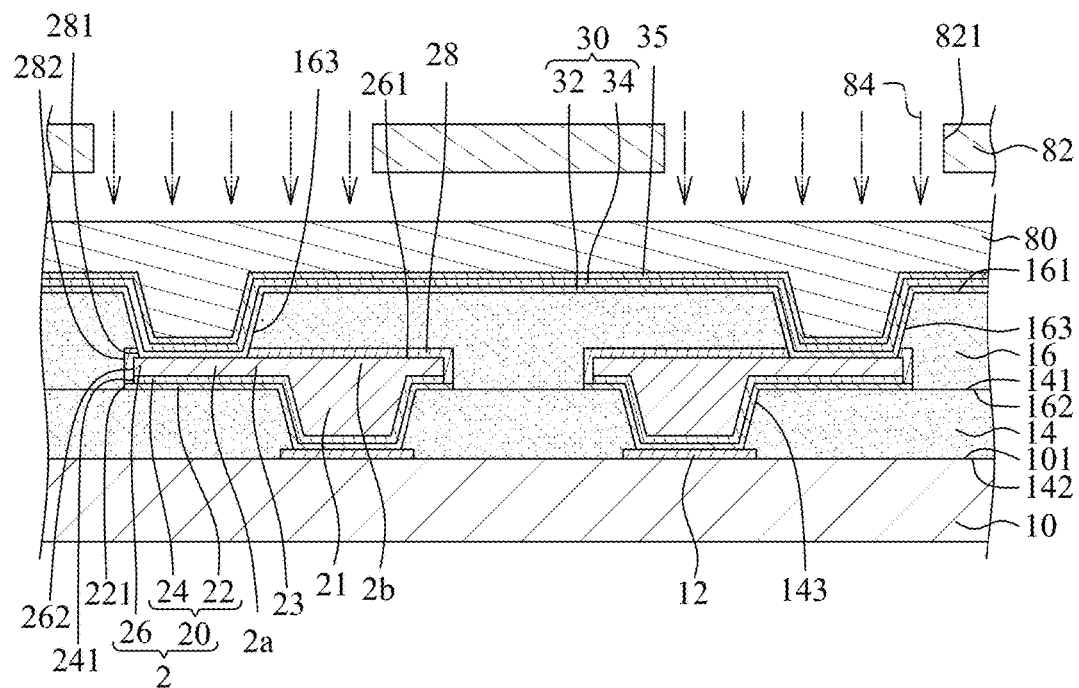
FIG. 22 illustrates one or more stages of an example of a method for manufacturing a semiconductor device according to some embodiments of the present disclosure.

Referring to FIG. 22, a second photoresist layer 80 is applied on the light absorbing layer 35. The second photoresist layer 80 can be formed from a "positive" acting material. Then, a third photomask 82 is provided above the second photoresist layer 80. The third photomask 82 defines at least one through hole 821 which extends through the third photomask 82. Light beams 84 emitted from a radiation source (e.g., UV source) are applied to the second photoresist layer 80 through the through hole 821 of the third photomask 82. That is, a portion of the second photoresist layer 80 corresponding to (e.g., under) the through hole 821 of the third photomask 82 is radiated by the light beams 84, and is an exposed portion which becomes dissolvable to the developer. The other portion of the second photoresist layer 80 corresponding to (e.g., under) the solid portion of the third photomask 82 is not radiated by the light beams 84, and is an unexposed portion which is insoluble in the developer.

During such exposure process, the light absorbing layer 35 which is disposed under the second photoresist layer 80 is a black or brown layer that can absorb most or all light beams that reach the light absorbing layer 35. That is, few or no light beams 84 are reflected back to the second photoresist layer 80 by the light absorbing layer 35. Thus, the light beams 84 along the original downward path radiating upon the second photoresist layer 80 are not influenced by the reflected light beams. As a result, the exposed portion of the second photoresist layer 80 can be formed precisely without defects, even when the size of the exposed portion is very small.

Figure 23:
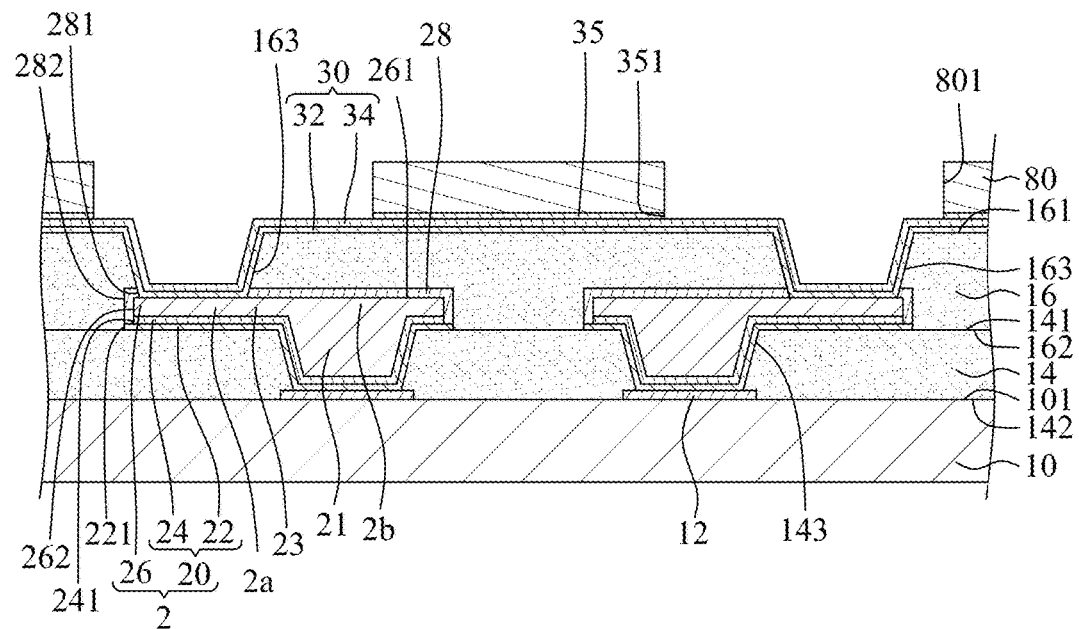
FIG. 23 illustrates one or more stages of an example of a method for manufacturing a semiconductor device according to some embodiments of the present disclosure.

Referring to FIG. 23, the second photomask 82 is removed. Then, a development process is conducted by applying a developer to the second photoresist layer 80 so as to dissolve and remove the exposed portion of the second photoresist layer 80. Thus, at least one through hole 801 which extends through the second photoresist layer 80 is formed. The through hole 801 of the second photoresist layer 80 is communicated with the second opening 163 of the second passivation layer 16, so that a portion of the light absorbing layer 35 is exposed from the through hole 801 of the second photoresist layer 80. It is noted that since the exposed portion of the second photoresist layer 80 can be formed precisely without defects, there is no nodule formed in the through hole 801 of the second photoresist layer 80. As a result, the through hole 801 of the second photoresist layer 80 can be formed precisely without defects.

Then, a surface flashing etching process is performed on the light absorbing layer 35, with the second photoresist layer 80 serving as a mask. A through hole 351 is formed on the light absorbing layer 35 at a position corresponding to the through hole 801 of the second photoresist layer 80, and extends through the light absorbing layer 25. At least a portion of the top surface of the upper layer 34 is exposed in the through hole 351. The seed layer 30b in the through hole 351 of the light absorbing layer 35 becomes the second seed layer 30 that is a two-layered structure including the lower layer 32 and the upper layer 34.

Figure 24:
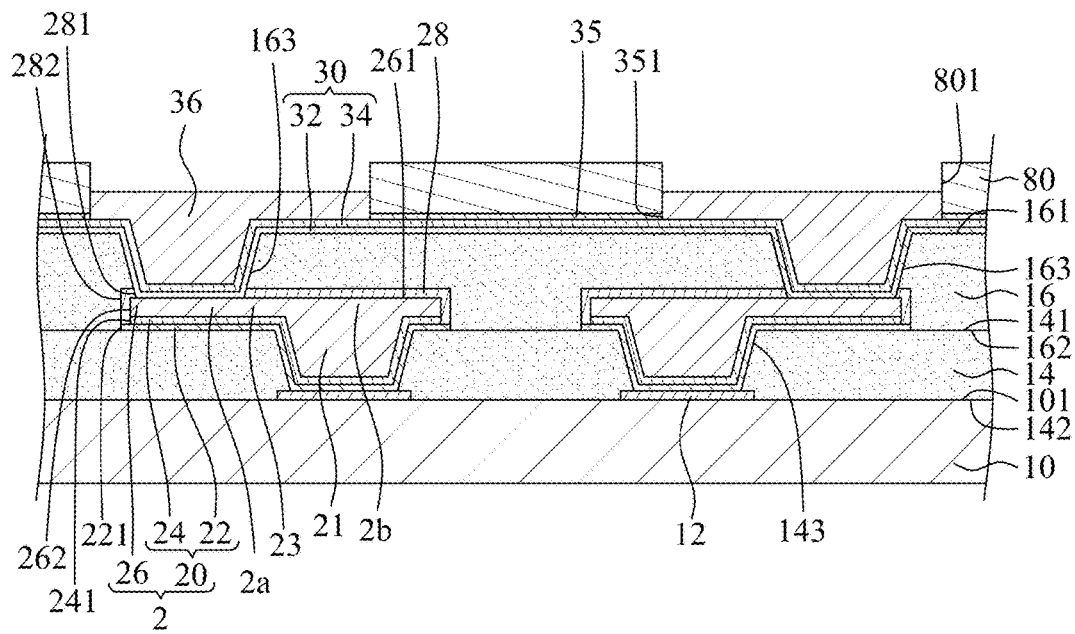
FIG. 24 illustrates one or more stages of an example of a method for manufacturing a semiconductor device according to some embodiments of the present disclosure.

Referring to FIG. 24, a second metal layer 36 is formed on the upper layer 34 of the second seed layer 30 in the through hole 351 of the light absorbing layer 35 and the through hole 801 of the second photoresist layer 80 so as to electrically connect the first circuit layer 2. The material of the second metal layer 36 may be copper (Cu).

Figure 25:
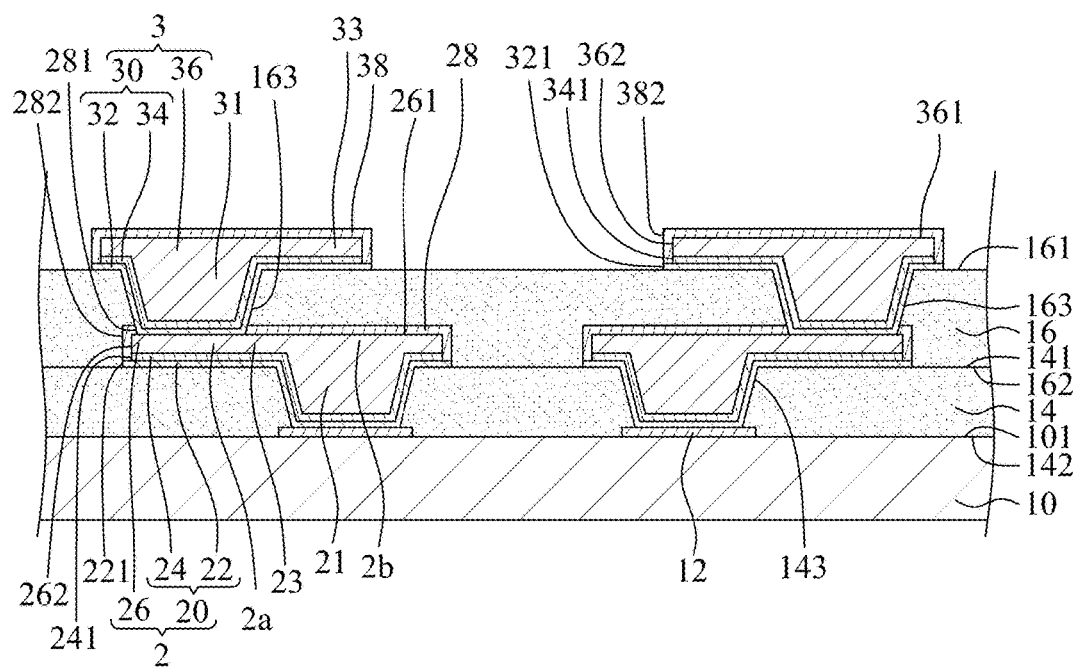
FIG. 25 illustrates one or more stages of an example of a method for manufacturing a semiconductor device according to some embodiments of the present disclosure.

Referring to FIG. 25, the second photoresist layer 80 is removed by, for example, stripping. Then, a partial flashing etching process is performed on the seed layer 30b (including the light absorbing layer 35, the upper layer 34 and the lower layer 32), with the second metal layer 36 serving as a mask. A second circuit layer 3 may be formed concurrently. The second circuit layer 3 is disposed on the first region 2a of the first circuit layer 2 in the second opening 163 of the second passivation layer 16 and on the second passivation layer 16. In some embodiments, a portion of the second circuit layer 3 is disposed in the second opening 163 of the second passivation layer 16 so to form a second conductive via 31. The other portion of the second circuit layer 3 is disposed on the first surface 161 of the second passivation layer 16 so as to form a second patterned layer 33 which may include at least one trace and/or at least one pad. The second conductive via 31 is electrically connected to and contacts the first region 2a of the first circuit layer 2, and the second conductive via 31 is disposed in the second passivation layer 16. The second conductive via 31 and the second patterned layer 33 may be formed integrally and concurrently. The second patterned layer 33 is electrically connected to the first circuit layer 2 through the second conductive via 31.

As shown in FIG. 25, the second circuit layer 3 includes the second seed layer 30 and the second metal layer 36. It is noted that the second conductive via 31 may include the second seed layer 30 and the second metal layer 36, and the second patterned layer 33 may also include the second seed layer 30 and the second metal layer 36.

A second light absorbing layer 38 is formed on the second circuit layer 3. In some embodiments, the second light absorbing layer 38 is a black or brown layer that can absorb most or all light beams that are emitted by a radiation source (e.g., UV source) and reach the second light absorbing layer 38. In some embodiments, a top surface and the lateral surface of the second metal layer 36 is oxidized to form the second light absorbing layer 38. Thus, the second light absorbing layer 38 is an oxide layer (e.g., copper oxide). After the oxidation process, the second light absorbing layer 38 is disposed on a top surface 361 and a lateral surface 362 of the second metal layer 36 of the second circuit layer 3. It is understood that the second light absorbing layer 38 may be included as a portion of the second circuit layer 3, or the second light absorbing layer 38 may be an additional layer that is attached or formed on the second circuit layer 3.

As shown in FIG. 25, the lateral surface of the upper layer 24 may be also oxidized concurrently. Thus, after the oxidation process, the second light absorbing layer 38 extends to and covers the lateral surface 341 of the upper layer 34 of the second seed layer 30. Further, the lower layer 32 is not oxidized, so that the lateral surface 321 of the lower layer 32 is exposed from the second light absorbing layer 38. That is, the second light absorbing layer 38 does not extend to or cover the lateral surface 321 of the lower layer 32. As shown in FIG. 25, the lateral surface 362 of the second metal layer 36 is substantially coplanar with the lateral surface 341 of the upper layer 34, both of which are not coplanar with the lateral surface 321 of the lower layer 32. A lateral surface 382 of the second light absorbing layer 38 is substantially coplanar with the lateral surface 321 of the lower layer 32.

In some embodiments, the first circuit layer 2 may be referred as the first conductive layer, and the second circuit layer 3 may be referred as the second conductive layer. The second conductive layer (e.g., the second circuit layer 3) contacts the first conductive layer (e.g., the first circuit layer 2) in the first through hole 281 of the first light absorbing layer 28.

Figure 26:
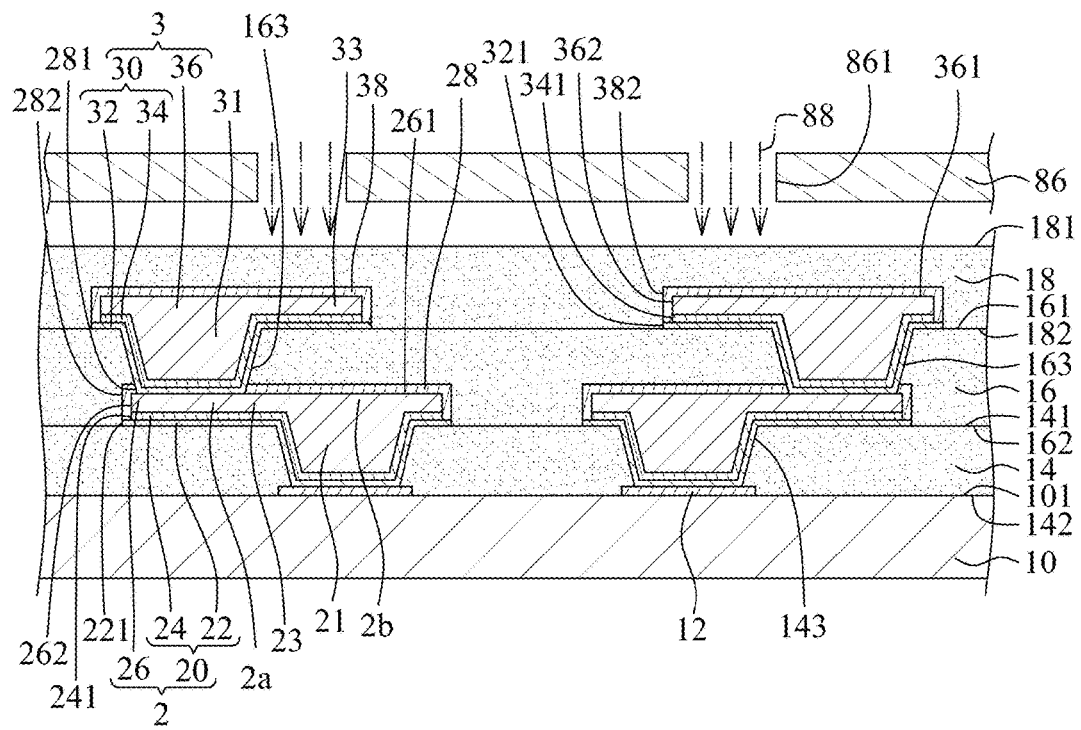
FIG. 26 illustrates one or more stages of an example of a method for manufacturing a semiconductor device according to some embodiments of the present disclosure.

Referring to FIG. 26, a third passivation layer 18 is formed on the first surface 161 of the second passivation layer 16 and the second light absorbing layer 38 (and the second circuit layer 3). The material of the third passivation layer 18 may be the same as or different from the material of the second passivation layer 16. The third passivation layer 18 has a first surface 181 and a second surface 182 opposite to the first surface 181.

A fourth photomask 86 is provided above the third passivation layer 18. The fourth photomask 86 defines at least one through hole 861 which extends through the fourth photomask 86. Light beams 88 emitted from a radiation source (e.g., UV source) are applied to the third passivation layer 18 through the through hole 861 of the fourth photomask 86. That is, a portion of the third passivation layer 18 corresponding to (e.g., under) the through hole 861 of the fourth photomask 86 is radiated by the light beams 88, and is an exposed portion which becomes dissolvable to the developer. The other portion of the third passivation layer 18 corresponding to (e.g., under) the solid portion of the fourth photomask 86 is not radiated by the light beams 88, and is an unexposed portion which is insoluble in the developer.

During such exposure process, the second light absorbing layer 38 is a black or brown layer that can absorb most or all light beams that reach the second light absorbing layer 38. That is, few or no light beams 88 are reflected back to the third passivation layer 18 by the second light absorbing layer 38. Thus, the light beams 88 along the original downward path radiating upon the third passivation layer 18 are not influenced by the reflected light beams. As a result, the exposed portion of the third passivation layer 18 can be formed precisely without defects even when the size of the exposed portion is very small.

Figure 27:
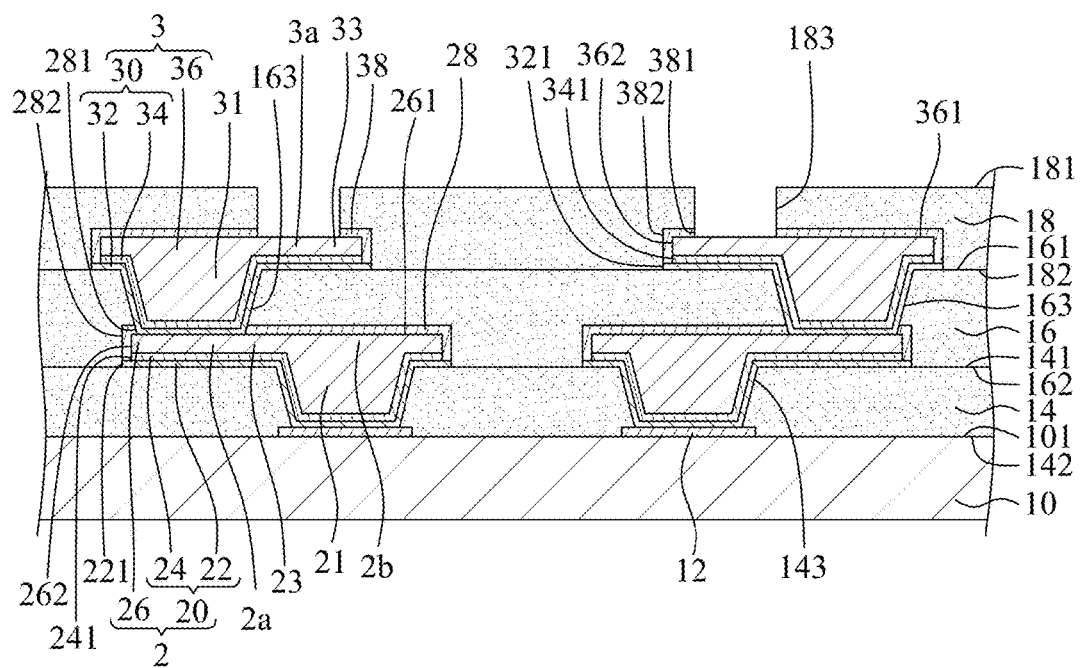
FIG. 27 illustrates one or more stages of an example of a method for manufacturing a semiconductor device according to some embodiments of the present disclosure.

Referring to FIG. 27, the fourth photomask 78 is removed. Then, a development process is conducted by applying a developer to the third passivation layer 18 so as to dissolve and remove the exposed portion of the third passivation layer 18. Thus, at least one third opening 183 that extends through the third passivation layer 18 is formed. It is noted that since the exposed portion of the third passivation layer 18 can be formed precisely without defects, there is no nodule formed in the third opening 183 of the third passivation layer 18. At least a portion of the second light absorbing layer 38 is exposed from the third opening 183 of the third passivation layer 18.

A surface flashing etching process is performed on the second light absorbing layer 38, with the third passivation layer 18 serving as a mask. The exposed part of the second light absorbing layer 38 is removed so as to form at least one second through hole 381. The second through hole 381 is formed on the second light absorbing layer 38 at a position corresponding to the third opening 183 of the third passivation layer 18, and extends through the second light absorbing layer 38. A region 3a of the second circuit layer 3 is exposed in the second through hole 381 of the second light absorbing layer 38.

Figure 28:
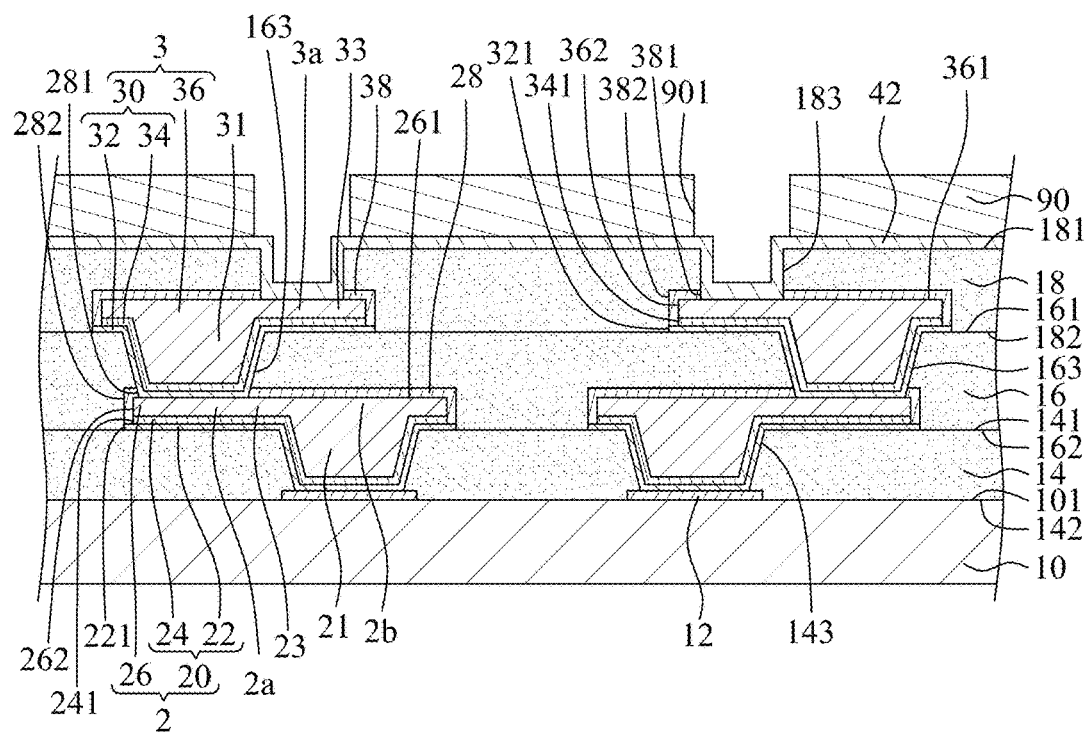
FIG. 28 illustrates one or more stages of an example of a method for manufacturing a semiconductor device according to some embodiments of the present disclosure.

Referring to FIG. 28, a third seed layer 42 is formed on the region 3a of the second circuit layer 3 in the third opening 183 of the third passivation layer 18 and the second through hole 381 of the second light absorbing layer 38. Further, the third seed layer 42 is also formed on the first surface 181 of the third passivation layer 18. The material of the third seed layer 42 may include, for example, titanium-copper (Ti—Cu) alloy. A third photoresist layer 90 is formed on the third seed layer 42. The third photoresist layer 90 defines at least one through hole 901 corresponding to the third opening 183 of the third passivation layer 18.

Figure 29:
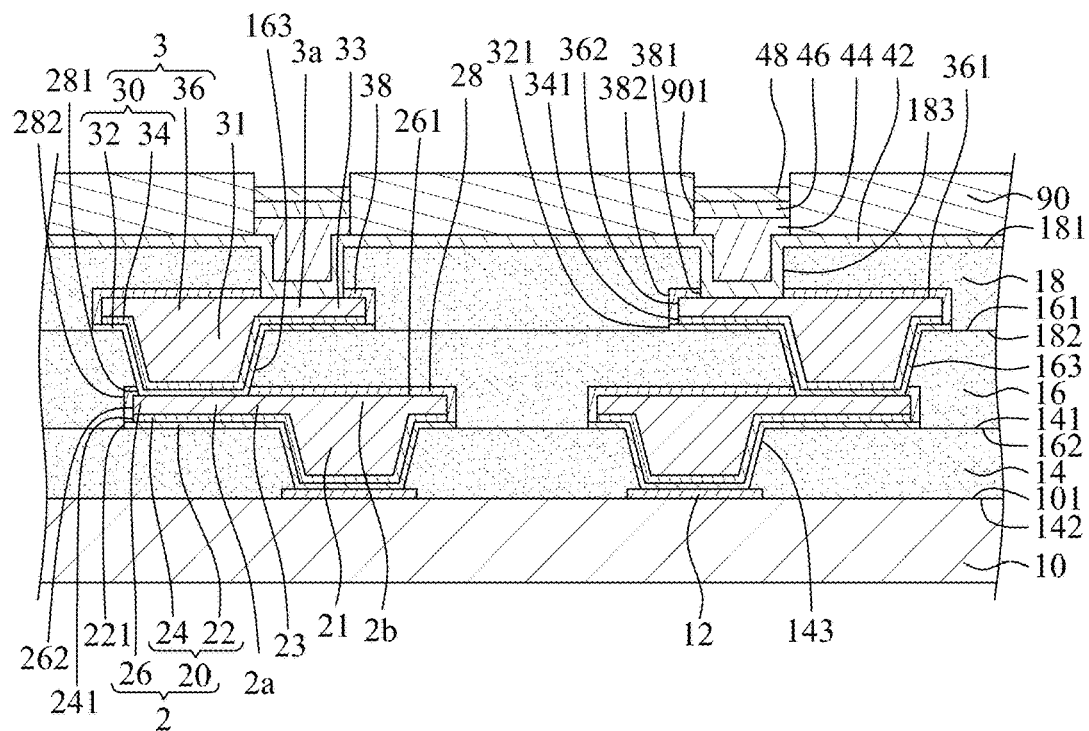
FIG. 29 illustrates one or more stages of an example of a method for manufacturing a semiconductor device according to some embodiments of the present disclosure.

Referring to FIG. 29, a third metal layer 44, a fourth metal layer 46 and a fifth metal layer 48 are formed in the through hole 901 of the third photoresist layer 90. The material of the third metal layer 44 may include, for example, copper. The material of the fourth metal layer 46 may include, for example, nickel (Ni). The material of the fifth metal layer 48 may include, for example, gold (Au). Other materials may additionally or alternatively be used for the metal layers. The third metal layer 44, the fourth metal layer 46 and the fifth metal layer 48 may be formed by, e.g., sputtering and plating, and thus, may have a small thickness.

Figure 30:
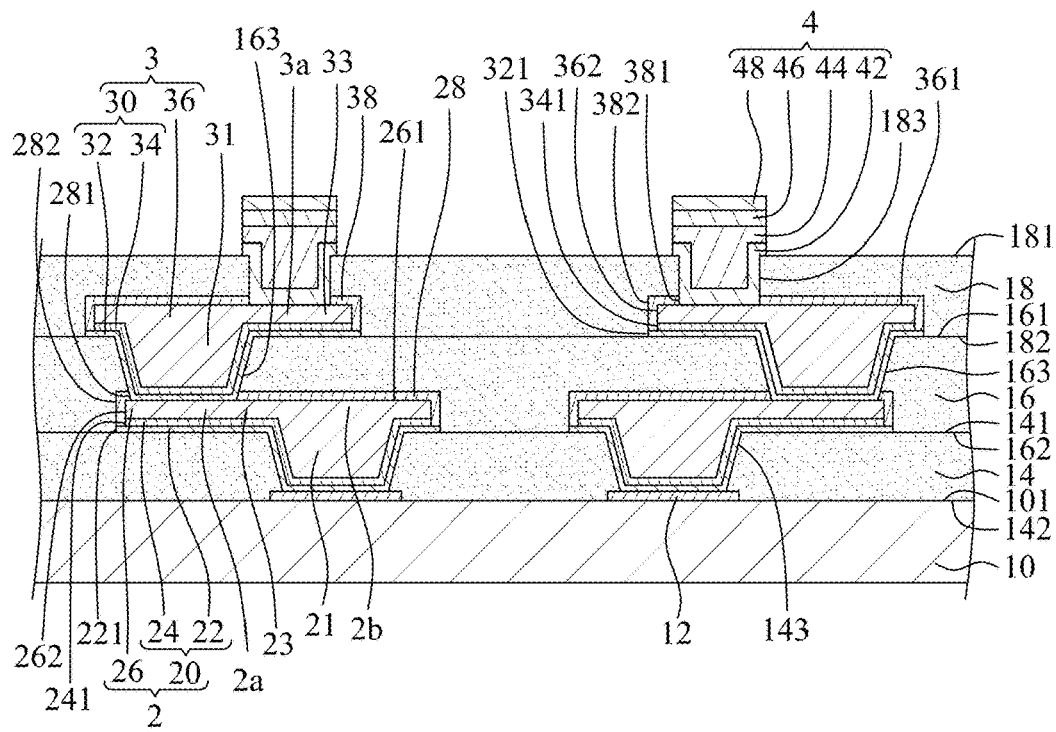
FIG. 30 illustrates one or more stages of an example of a method for manufacturing a semiconductor device according to some embodiments of the present disclosure.

Referring to FIG. 30, the third photoresist layer 90 is then removed by, for example, stripping. A partial flashing etching process is performed on the third seed layer 42, with the fifth metal layer 48 serving as a mask. At least one bump pad 4 may be formed concurrently. The bump pad 4 is disposed in a respective third opening 183 defined by the third passivation layer 18 and the second through hole 381 of the second light absorbing layer 38, and on the region 3a of the second circuit layer 3. The bump pads 4 may protrude from the first surface 181 of the third passivation layer 18. The bump pad 40 includes the third seed layer 42, the third metal layer 44, the fourth metal layer 46 and the fifth metal layer 48.

Figure 31:
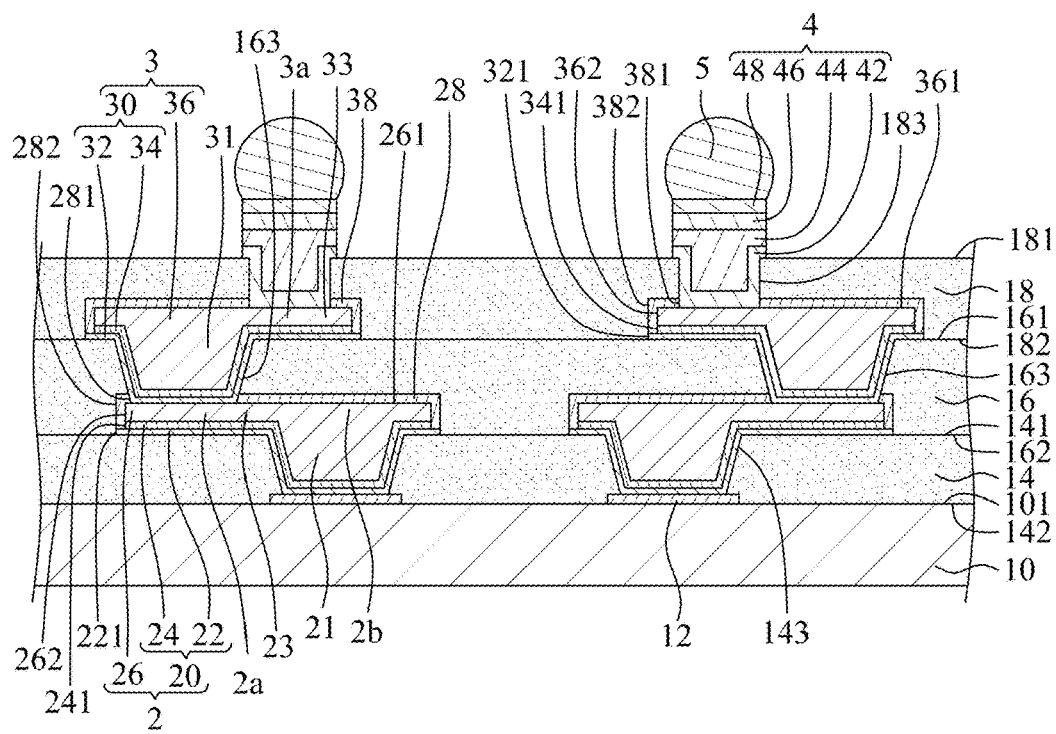
FIG. 31 illustrates one or more stages of an example of a method for manufacturing a semiconductor device according to some embodiments of the present disclosure.

Referring to FIG. 31, at least one external connector 5 (e.g., solder ball) is disposed on the fifth metal layer 48 of a respective bump pad 4 for external connection. In some embodiments, the external connector 5 may be substantially in a hemisphere shape. Then, a singulation process may be conducted to form the semiconductor device 1 as shown in FIG. 1 and FIG. 1A.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
   at least one base element including at least one conductive pad;
   at least one passivation layer disposed on the base element, wherein the passivation layer includes a photoresist layer;
   at least one circuit layer electrically connected to the conductive pad and disposed in the passivation layer; and
   at least one light absorbing layer disposed on the circuit layer.

2. The semiconductor device according to claim 1, wherein the light absorbing layer is a black or brown layer.

3. The semiconductor device according to claim 1, wherein the light absorbing layer is an oxide layer that is an oxidized portion of the circuit layer.

4. The semiconductor device according to claim 1, wherein the at least one passivation layer includes a first passivation layer that defines at least one first opening to expose the conductive pad of the base element, the at least one circuit layer includes a first circuit layer that is disposed on the conductive pad of the base element in the first opening and on the first passivation layer, and the at least one light absorbing layer includes a first light absorbing layer that is disposed on the first circuit layer.

5. The semiconductor device according to claim 4, wherein the first circuit layer includes a first seed layer and a first metal layer, the first seed layer is disposed on the conductive pad of the base element in the first opening and on the first passivation layer, the first metal layer is disposed on the first seed layer, and the first light absorbing layer is disposed on a top surface and a lateral surface of the first metal layer.

6. The semiconductor device according to claim 5, wherein the first light absorbing layer extends to at least a portion of a lateral surface of the first seed layer.

7. The semiconductor device according to claim 5, wherein the first seed layer includes a lower layer and an upper layer, the first light absorbing layer extends to a lateral surface of the upper layer of the first seed layer.

8. The semiconductor device according to claim 7, wherein a lateral surface of the lower layer of the first seed layer is exposed from the first light absorbing layer.

9. The semiconductor device according to claim 4, wherein the first light absorbing layer defines at least one first through hole, the at least one passivation layer further includes a second passivation layer disposed on the first passivation layer, the second passivation layer defines at least one second opening corresponding to the first through hole of the first light absorbing layer to expose a first region of the first circuit layer, and the at least one circuit layer further includes a second circuit layer that is disposed in the second opening of the second passivation layer and contacts the first region of the first circuit layer directly.

10. The semiconductor device according to claim 9, wherein the first circuit layer includes a second region covered by the first light absorbing layer, a surface roughness of the first region of the first circuit layer is greater than a surface roughness of the second region of the first circuit layer.

11. The semiconductor device according to claim 1, wherein the light absorbing layer covers a top surface and a lateral surface of the circuit layer.

12. The semiconductor device according to claim 1, wherein the light absorbing layer has a trichome shape on a surface thereof.

13. The semiconductor device according to claim 1, further comprising an encapsulant covering the base element and the passivation layer.

14. A method for manufacturing a semiconductor device, comprising:
   (a) forming at least one passivation layer on a base element;
   (b) forming at least one first conductive layer in the passivation layer to electrically connect to the base element;
   (c) forming at least one light absorbing layer on the first conductive layer; and
   (d) forming at least one second conductive layer to electrically connect to the first conductive layer.

15. The method of claim 14, wherein in (b), the first conductive layer is a first circuit layer, and in (d), the second conductive layer is a second circuit layer.

16. The method of claim 14, wherein (a) comprises forming a first passivation layer on the base element, wherein the first passivation layer defines at least one first opening to expose a portion of the base element;
   wherein in (b), the first conductive layer is formed in the first opening of the first passivation layer to electrically connect to the base element;
   wherein after (c), the method further comprises:
   (c1) forming a second passivation layer on the first passivation layer and the first conductive layer, wherein the second passivation layer defines at least one second opening; and
   wherein in (d), the second conductive layer is formed in the at least one second opening of the second passivation layer.

17. The method of claim 14, wherein in (b), the first conductive layer is a first seed layer of a first circuit layer, and in (d), the second conductive layer is a first metal layer of the first circuit layer.

18. The method of claim 14, wherein (c) comprises oxidizing a portion of the first conductive layer to form the light absorbing layer.

19. The method of claim 14, wherein after (c), the method further comprises:
   (c1) removing a part of the light absorbing layer to form a through hole to expose a portion of the first conductive layer;
   wherein in (d), the second conductive layer contacts the first conductive layer in the through hole.

* * * * *